(12) United States Patent
Guo et al.

(10) Patent No.: US 11,367,801 B2
(45) Date of Patent: Jun. 21, 2022

(54) COLORED FILTER ASSEMBLIES FOR HIGHLY-EFFICIENT AND ANGLE-ROBUST PHOTOVOLTAIC DEVICES

(71) Applicants: THE REGENTS OF THE UNIVERSITY OF MICHIGAN, Ann Arbor, MI (US); TOYOTA MOTOR CORPORATION, Toyota (JP)

(72) Inventors: Lingjie Jay Guo, Ann Arbor, MI (US); Chengang Ji, Ann Arbor, MI (US); Taizo Masuda, Yokohama (JP); Yuki Kudo, Susono (JP)

(73) Assignees: THE REGENTS OF THE UNIVERSITY OF MICHIGAN, Ann Arbor, MI (US); Toyota Motor Corporation, Toyota (JP)

( * ) Notice: Subject to any disclaimer, the term of this patent is extended or adjusted under 35 U.S.C. 154(b) by 0 days.

(21) Appl. No.: 16/762,774

(22) PCT Filed: Nov. 9, 2018

(86) PCT No.: PCT/US2018/060147
§ 371 (c)(1),
(2) Date: May 8, 2020

(87) PCT Pub. No.: WO2019/094810
PCT Pub. Date: May 16, 2019

(65) Prior Publication Data
US 2020/0365751 A1    Nov. 19, 2020

Related U.S. Application Data

(60) Provisional application No. 62/583,966, filed on Nov. 9, 2017.

(51) Int. Cl.
*H01L 31/054* (2014.01)
*G02B 5/26* (2006.01)
(Continued)

(52) U.S. Cl.
CPC ............ *H01L 31/0547* (2014.12); *G02B 5/26* (2013.01); *G02B 5/285* (2013.01); *G02F 1/015* (2013.01);
(Continued)

(58) Field of Classification Search
CPC .................. H01L 31/054; H01L 31/0549; H01L 31/0547
See application file for complete search history.

(56) References Cited

U.S. PATENT DOCUMENTS 5,403,405 A * 4/1995 Fraas ...................... H02S 10/30
136/253
8,547,504 B2   10/2013 Guo et al.
(Continued)

FOREIGN PATENT DOCUMENTS

CN      111742415 A    10/2020
JP      2021502703 A   1/2021
(Continued)

OTHER PUBLICATIONS

International Search Report and Written Opinion for International Application No. PCT/US2018/060147 dated Mar. 5, 2019 (ISA/KR), 13 pages.
(Continued)

*Primary Examiner* — Christina Chern
(74) *Attorney, Agent, or Firm* — Harness, Dickey & Pierce, P.L.C.

(57) ABSTRACT

Angle insensitive/angle-robust colored filter assemblies are provided for use with a photovoltaic device to create a decorative and colored photovoltaic device assembly. The filter may be passive or active with an ultrathin reflective layer of high refractive index material, like amorphous silicon (a-Si). A passive filter may have transparent first and second pairs of dielectric materials surrounding the ultrathin reflective layer. An active filter may have transparent first
(Continued)

and second electrodes and first and second doped hole/electron transport layer surrounding the ultrathin reflective layer. The filter can transmit a portion and reflect a portion of the electromagnetic spectrum to generate a reflected color output with minimal angle dependence. Angle insensitive colored photovoltaic device assemblies having high power conversion efficiencies (e.g., ≥18%) including a passive or active colored reflective filter and a photovoltaic device are also contemplated. The photovoltaic device may include a photoactive layer comprising crystalline silicon (c-Si).

17 Claims, 15 Drawing Sheets

(51) Int. Cl.
  *G02F 1/015* (2006.01)
  *H01L 31/0224* (2006.01)
  *G02B 5/28* (2006.01)
(52) U.S. Cl.
  CPC .. *H01L 31/022466* (2013.01); *H01L 31/0549* (2014.12)

(56) References Cited

U.S. PATENT DOCUMENTS

| | | | |
|---|---|---|---|
| 9,261,753 | B2 | 2/2016 | Guo et al. |
| 2015/0309229 | A1 | 10/2015 | Ren et al. |
| 2016/0252652 | A1 | 9/2016 | Shen et al. |
| 2016/0254403 | A1 | 9/2016 | Guo et al. |
| 2016/0273958 | A1 | 9/2016 | Hoenk et al. |
| 2017/0033250 | A1* | 2/2017 | Ballif ............... F24S 20/60 |
| 2019/0036473 | A1* | 1/2019 | Sablon ............. H01L 31/02168 |

FOREIGN PATENT DOCUMENTS

| | | | |
|---|---|---|---|
| WO | 2014170323 | A1 | 10/2014 |
| WO | 2015066623 | A1 | 5/2015 |
| WO | 2019094810 | A1 | 5/2019 |

OTHER PUBLICATIONS

Ahmad, Shahzada, et al. "Metal free sensitizer and catalyst for dye sensitized solar cells," Energy & Environmental Science 6,12 (2013), pp. 3439-3466.

Ameri, Tayebeh, et al. "Fabrication, optical modeling, and color characterization of semitransparent bulk-heterojunction organic solar cells in an inverted structure." Advanced Functional Materials 20.10 (2010): 1592-1598.

Banerjee, C., et al. "Development of n-μc-SiO x: H as cost effective back reflector and its application to thin film amorphous silicon solar cells." Solar Energy 97 (2013): 591-595.

Chen, Yi-Hong, et al. "Microcavity-Embedded, Colour-Tuneable, Transparent Organic Solar Cells." Advanced Materials 26.7 (2014): 1129-1134.

Janthong, Bancha, et al. "Novel a-Si: H/μc-Si: H tandem cell with lower optical loss." Journal of Non-Crystalline Solids 358.17 (2012): 2478-2481.

Lambertz, A et al., "Hydrogenated amorphous silicon oxide containing a microcrystalline silicon phase and usage as an intermediate reflector in thin-film silicon solar cells." Journal of applied physics 109.11 (2011): 113109.

Lee, Jae Yong, et al. "Decorative power generating panels creating angle insensitive transmissive colors." Scientific reports 4 (2014).

Lee, Kyu-Tae, et al. "Colored ultrathin hybrid photovoltaics with high quantum efficiency." Light: Science & Applications 3.10 (2014): e215.

Nakada, Kazuyoshi, Shinsuke Miyajima, and Makoto Konagai. "Application of n-type microcrystalline silicon oxide as back reflector of crystalline silicon heterojunction solar cells." Japanese Journal of Applied Physics 54.8 (2015): 082301.

Ok, Jong G., et al. "Photo-Roll Lithography (PRL) for Continuous and Scalable Patterning with Application in Flexible Electronics." Advanced Materials 25.45 (2013): 6554-6561.

Park, Hui Joon, et al. "Photonic color filters integrated with organic solar cells for energy harvesting." Acs Nano 5.9 (2011): 7055-7060.

Tan, Hairen, et al. "Wide bandgap p-type nanocrystalline silicon oxide as window layer for high performance thin-film silicon multi-junction solar cells" Solar Energy Materials and Solar Cells 132 (2015): 597-605.

* cited by examiner

COLORED FILTER ASSEMBLIES FOR HIGHLY-EFFICIENT AND ANGLE-ROBUST PHOTOVOLTAIC DEVICES

CROSS-REFERENCE TO RELATED APPLICATIONS

This application is the U.S. National Phase Application under 35 U.S.C. 371 of International Application No. PCT/US2018/060147 filed on Nov. 9, 2018, which claims the benefit of U.S. Provisional Application No. 62/583,966 filed on Nov. 9, 2017. The entire disclosures of the above applications are incorporated herein by reference.

FIELD

The present disclosure relates to highly-efficient and angular-robust colored angle insensitive filter assemblies, as well as to angle insensitive colored photovoltaic device assemblies that include a passive colored reflective filter and a photovoltaic device and to angle insensitive colored photovoltaic device assemblies that include an active colored reflective filter and a photovoltaic device.

BACKGROUND

This section provides background information related to the present disclosure which is not necessarily prior art.

Photovoltaics (PVs) hold great promise to replace traditional fossil fuels by providing the capability to harvest inexhaustible solar energy. To improve PV feasibility, efforts to increase power conversion efficiency (PCE) and lower production costs have been an ongoing pursuit. PVs based on crystalline silicon (c-Si) photoactive material, whose absorption is up to wavelengths of approximately 1,100 nm, offer tremendous potential due to not only the abundance and availability of the material, but also the high PCEs that can be achieved (e.g., over 20%). However, solar cells/PVs incorporating c-Si photoactive materials have a black and dull appearance, which significantly hinders their use in various applications, including for decorative purposes on vehicles and building exteriors, by way of non-limiting example. In view of the undesirable aesthetics of current solar cells, many opportunities are missed to exploit available solar energy, which is currently wasted.

Various scenarios, such as dyed sensitized solar cells (DSSCs) and organic PVs (OPVs) have been proposed to create colored solar cells. However, those colors heavily depend on the types of the materials used and further the color tunability is very limited. Moreover, the organic components included in such structures are highly sensitive and suffer from a lifetime of issues, for example, requiring special passivation techniques to withstand oxygen and moisture. Recently, a scheme of introducing colored filters into PV panels has been developed to permit the generation of electric power through the simultaneous harvesting of the absorbed light. However, the colored filters involved in those solar cells are based either on Fabry-Pérot (F-P) interferometer cavities or plasmonic resonance which produce colors that are highly sensitive to viewing angle (e.g., vary with viewing angles and incidence light polarizations) and thus are undesirable for the decorative coatings. In addition, it is also a problem to scale such nano-structured plasmonic colored filters to large areas. Further, one dimensional (1D) layered solar cells integrating amorphous silicon (a-Si) featuring angular and polarization insensitive colors into a PV assembly have been used. The non-iridescent colored appearance can be credited to the nontrivial reflection phase change at an interface of the a-Si and metal, which consequently compensates for the propagation phase of light propagating through the ultrathin a-Si layer (<30 nm). However, the power conversion efficiency (PCE) for such a semi-transparent PV panel is limited to only about 2% because of the small amount of light absorbed. Therefore, it would be desirable to develop multifunctional solar cells/PVs that can offer superior performance with high PCE, while also providing attractive decorative aesthetics and design features.

SUMMARY

This section provides a general summary of the disclosure, and is not a comprehensive disclosure of its full scope or all of its features.

The present disclosure contemplates, in one variation, a colored filter for use with a photovoltaic device. The filter comprises an ultrathin reflective layer defining a first side and a second side. The filter also comprises a transparent first pair of dielectric materials adjacent to the first side of the ultrathin reflective layer, wherein the first pair comprises a first layer of a dielectric material and a second layer of a distinct dielectric material. A transparent second pair of dielectric materials is disposed adjacent to the second side of the ultrathin reflective layer, wherein the second pair comprises a third layer of a dielectric material and a fourth layer of a distinct dielectric material. The filter is capable of transmitting a first portion of an electromagnetic spectrum having a first range of predetermined wavelengths and reflecting a second portion of the electromagnetic spectrum having a second range of predetermined wavelengths to generate a reflected output.

In one aspect, the reflected output displays minimal angle dependence such that the second range of wavelengths varies less than or equal to about 80 nm at an incidence angle ranging from about 0° to about 60° with respect to the colored filter to form an angle insensitive colored filter.

In one aspect, the ultrathin reflective layer comprises an amorphous silicon (a-Si) material.

In one aspect, the ultrathin reflective layer has a thickness of less than or equal to about 15 nm.

In one aspect, the ultrathin reflective layer has a thickness of greater than or equal to about 5 nm to less than or equal to about 12 nm.

In one aspect, the reflected output with the second range of predetermined wavelengths is in a visible light range and has a color selected from the group consisting of: red, green, blue, and combinations thereof.

In one aspect, the dielectric material forming each of the first layer, the second layer, the third layer, and the fourth layer is independently selected from the group consisting of: silicon nitride ($Si_3N_4$), titanium oxide ($TiO_2$), and silicon dioxide ($SiO_2$), zinc oxide (ZnO), hafnium oxide ($HfO_2$), molybdenum trioxide ($MoO_3$), tantalum pentoxide ($Ta_2O_5$), niobium pentoxide ($Nb_2O_5$), oxide tungsten trioxide ($WO_3$), zinc selenide (ZnSe), zinc sulfide (ZnS), aluminum oxide ($Al_2O_3$), magnesium fluoride ($MgF_2$), and polymers with a refractive index greater than or equal to about 1.6.

In one aspect, the dielectric material forming each of the first layer, the second layer, the third layer, and the fourth layer is independently selected from the group consisting of: silicon nitride ($Si_3N_4$), zinc selenide (ZnSe), titanium oxide ($TiO_2$), and silicon dioxide ($SiO_2$).

In one aspect, the first layer comprises silicon dioxide ($SiO_2$), the second layer comprises titanium oxide ($TiO_2$), the third layer comprises titanium oxide (TiO$_2$), and the fourth layer comprises silicon nitride (Si$_3$N$_4$).

In one aspect, the first layer comprises silicon nitride (Si$_3$N$_4$), the second layer comprises zinc selenide (ZnSe), the third layer comprises zinc selenide (ZnSe), and the fourth layer comprises silicon nitride (Si$_3$N$_4$).

In one aspect, the first layer has a thickness of greater than or equal to about 50 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 50 nm to less than or equal to about 300 nm.

In one aspect, the reflected output having the second range of predetermined wavelengths exhibits a blue color. The ultrathin reflective layer has a thickness of greater than or equal to about 5 nm to less than or equal to about 12 nm. The first layer has a thickness of greater than or equal to about 50 nm to less than or equal to about 200 nm, the second layer has a thickness of greater than or equal to about 10 nm to less than or equal to about 150 nm, the third layer has a thickness of greater than or equal to about 10 nm to less than or equal to about 150 nm, and the fourth layer has a thickness of greater than or equal to about 50 nm to less than or equal to about 200 nm.

In one aspect, the reflected output having the second range of predetermined wavelengths exhibits a green color. The ultrathin reflective layer has a thickness of greater than or equal to about 5 nm to less than or equal to about 12 nm. The first layer has a thickness of greater than or equal to about 100 nm to less than or equal to about 200 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 200 nm.

In one aspect, the reflected output having the second range of predetermined wavelengths exhibits a red color. The ultrathin reflective layer has a thickness of greater than or equal to about 5 nm to less than or equal to about 12 nm. The first layer has a thickness of greater than or equal to about 100 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 300 nm.

The present disclosure also provides in certain variations, an angle insensitive colored photovoltaic device assembly that comprises a colored reflective filter and a photovoltaic device. The colored reflective filter comprises an ultrathin reflective layer defining a first side and a second side. A transparent first pair of dielectric materials is disposed adjacent to the first side of the ultrathin reflective layer, wherein the first pair comprises a first layer of a dielectric material and a second layer of a distinct dielectric material. A transparent second pair of dielectric materials is disposed adjacent to the second side of the ultrathin reflective layer, wherein the second pair comprises a third layer of a dielectric material and a fourth layer of a distinct dielectric material. The filter is capable of transmitting a first portion of an electromagnetic spectrum having a first range of predetermined wavelengths and reflecting a second portion of the electromagnetic spectrum having a second range of predetermined wavelengths to generate a reflected output that displays minimal angle dependence. The photovoltaic device is disposed adjacent to the colored reflective filter. The photovoltaic device comprises at least one photoactive material.

In one aspect, a power conversion efficiency of the photovoltaic device is greater than or equal to about 18%.

In one aspect, the angle insensitive colored photovoltaic device assembly of claim 13, wherein the photoactive material comprises a crystalline silicon (c-Si) material.

In one aspect, the ultrathin reflective layer comprises an amorphous silicon (a-Si) material.

In one aspect, the ultrathin reflective layer has a thickness of less than or equal to about 15 nm.

In one aspect, the reflected output with the second range of predetermined wavelengths is in a visible light range and has a color selected from the group consisting of: red, green, blue, and combinations thereof.

In one aspect, the dielectric material forming each of the first layer, the second layer, the third layer, and the fourth layer is independently selected from the group consisting of: silicon nitride (Si$_3$N$_4$), titanium oxide (TiO$_2$), and silicon dioxide (SiO$_2$), zinc oxide (ZnO), hafnium oxide (HfO$_2$), molybdenum trioxide (MoO$_3$), tantalum pentoxide (Ta$_2$O$_5$), niobium pentoxide (Nb$_2$O$_5$), oxide tungsten trioxide (WO$_3$), zinc selenide (ZnSe), zinc sulfide (ZnS), aluminum oxide (Al$_2$O$_3$), magnesium fluoride (MgF$_2$), and polymers with a refractive index greater than or equal to about 1.6.

In one aspect, the dielectric material forming each of the first layer, the second layer, the third layer, and the fourth layer is independently selected from the group consisting of: silicon nitride (Si$_3$N$_4$), zinc selenide (ZnSe), titanium oxide (TiO$_2$), and silicon dioxide (SiO$_2$).

In one aspect, the first layer comprises silicon dioxide (SiO$_2$), the second layer comprises titanium oxide (TiO$_2$), the third layer comprises titanium oxide (TiO$_2$), and the fourth layer comprises silicon nitride (Si$_3$N$_4$).

In one aspect, the first layer comprises silicon nitride (Si$_3$N$_4$), the second layer comprises zinc selenide (ZnSe), the third layer comprises zinc selenide (ZnSe), and the fourth layer comprises silicon nitride (Si$_3$N$_4$).

In one aspect, the first layer has a thickness of greater than or equal to about 50 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 50 nm to less than or equal to about 300 nm.

In one aspect, the reflected output having the second range of predetermined wavelengths exhibits a blue color. The ultrathin reflective layer has a thickness of greater than or equal to about 5 nm to less than or equal to about 12 nm. The first layer has a thickness of greater than or equal to about 50 nm to less than or equal to about 200 nm, the second layer has a thickness of greater than or equal to about 10 nm to less than or equal to about 150 nm, the third layer has a thickness of greater than or equal to about 10 nm to less than or equal to about 150 nm, and the fourth layer has a thickness of greater than or equal to about 50 nm to less than or equal to about 200 nm.

In one aspect, the reflected output having the second range of predetermined wavelengths exhibits a green color. The ultrathin reflective layer has a thickness of greater than or equal to about 5 nm to less than or equal to about 12 nm. The first layer has a thickness of greater than or equal to about 100 nm to less than or equal to about 200 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 200 nm.

In one aspect, the reflected output having the second range of predetermined wavelengths exhibits a red color. The ultrathin reflective layer has a thickness of greater than or equal to about 5 nm to less than or equal to about 12 nm. The first layer has a thickness of greater than or equal to about 100 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 300 nm.

In certain other variations, the present disclosure contemplates an active colored reflective filter for use with a photovoltaic device. The filter comprises an ultrathin reflective layer defining a first side and a second side. The active reflective colored filter further includes a first transparent electrode having a first polarity and a second transparent electrode having a second polarity opposite to the first polarity. The active colored reflective filter is capable of transmitting a first portion of an electromagnetic spectrum having a first range of predetermined wavelengths and reflecting a second portion of the electromagnetic spectrum having a second range of predetermined wavelengths to generate a reflected output.

In one aspect, the reflected output displays minimal angle dependence such that the second range of predetermined wavelengths varies less than or equal to about 80 nm at an incidence angle ranging from about 0° to about 60° with respect to the active colored reflective filter to form an angle insensitive active reflective colored filter.

In one aspect, the active colored reflective filter further comprises a first doped layer disposed between the first transparent electrode and the ultrathin reflective layer and a second doped layer disposed between the ultrathin reflective layer and the second transparent electrode.

In one aspect, the ultrathin reflective layer comprises an amorphous silicon (a-Si) material. The first doped layer comprises an n-doped silicon oxide ($SiO_x$). The second doped layer comprises a p-doped silicon oxide ($SiO_x$). The first transparent electrode and second transparent electrode independently comprise a material selected from the group consisting of aluminum-doped zinc oxide (AZO), indium tin oxide (ITO), indium zinc oxide (IZO), magnesium and gallium co-doped zinc oxide (MGZO), boron doped zinc oxide (BZO), and combinations thereof.

In one aspect, the first transparent electrode has a thickness of greater than or equal to about 50 nm to less than or equal to about 200 nm. The second transparent electrode has a thickness of greater than or equal to about 750 nm to less than or equal to about 1.5 micrometers. The first doped layer has a thickness of greater than or equal to about 10 nm to less than or equal to about 20 nm. The second doped layer has a thickness of greater than or equal to about 5 nm to less than or equal to about 20 nm. The ultrathin reflective layer has a thickness of greater than or equal to about 5 nm to less than or equal to about 55 nm.

The present disclosure also contemplates an angle insensitive colored photovoltaic device assembly that comprises an active colored reflective filter and a photovoltaic device. The active colored reflective filter comprises an ultrathin reflective layer defining a first side and a second side. A first transparent electrode has a first polarity, while a second transparent electrode having a second polarity opposite to the first polarity is also included. The active colored reflective filter is capable of transmitting a first portion of an electromagnetic spectrum having a first range of predetermined wavelengths and reflecting a second portion of the electromagnetic spectrum having a second range of predetermined wavelengths to generate a reflected output. The photovoltaic device is adjacent to the active colored reflective filter. The photovoltaic device comprises at least one photoactive material.

In one aspect, the reflected output displays minimal angle dependence such that the second range of predetermined wavelengths varies less than or equal to about 80 nm at an incidence angle ranging from about 0° to about 60° with respect to the active colored reflective filter.

In one aspect, the first transparent electrode and the second transparent electrode comprise a material independently selected from the group consisting of: indium tin oxide (ITO) and indium zinc oxide (IZO), the ultrathin reflective layer comprises an amorphous silicon (a-Si) material, and the photoactive material comprises crystalline silicon (c-Si).

In one aspect, the active colored reflective filter further comprises a first charge transport layer disposed between the first transparent electrode and the ultrathin reflective layer and a second charge transport layer disposed between the ultrathin reflective layer and the second transparent electrode.

In one aspect, the active colored reflective filter further comprises a first doped layer disposed between the first transparent electrode and the ultrathin reflective layer and a second doped layer disposed between the ultrathin reflective layer and the second transparent electrode.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4:
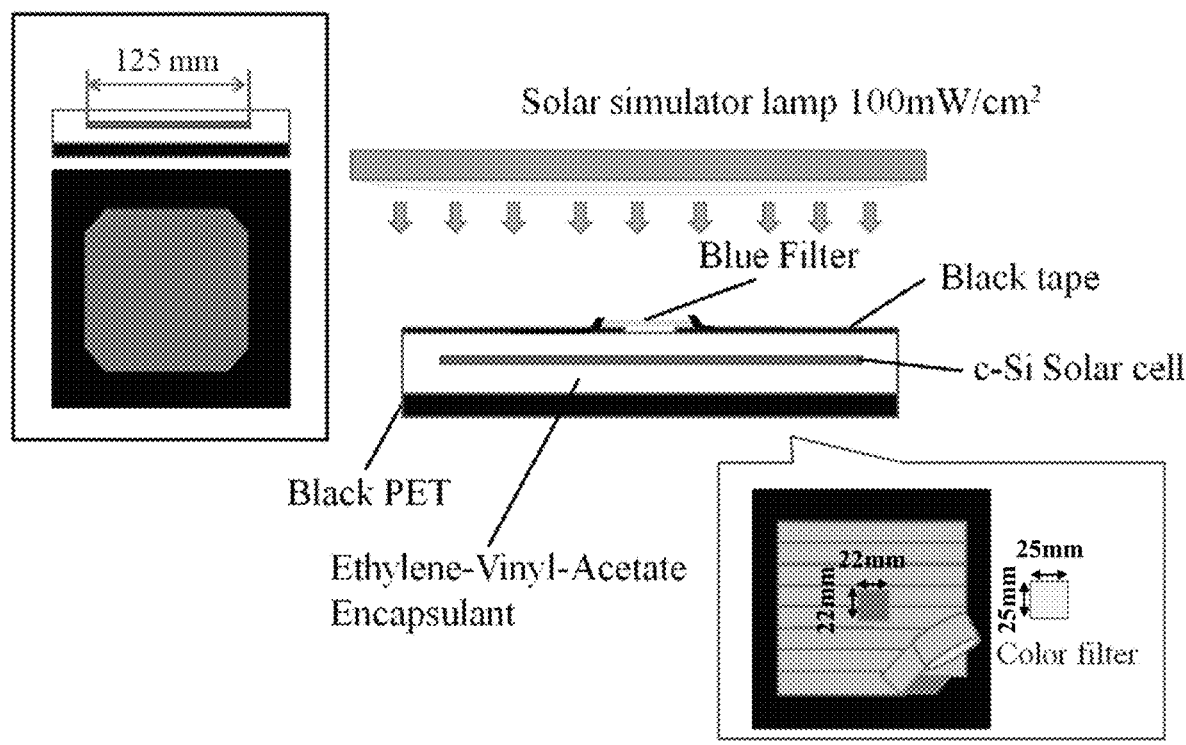

FIG. 4 is a schematic diagram showing a setup for current density-voltage (J-V) data acquisition of an angle insensitive colored photovoltaic device assembly having a passive colored reflective filter and an integrated photovoltaic device. Insets at the top left and bottom right present the dimensions of the c-Si photovoltaic device/solar panel and aluminum foil opening at the top surface, respectively.

Figures 5A, 5B, 5C:
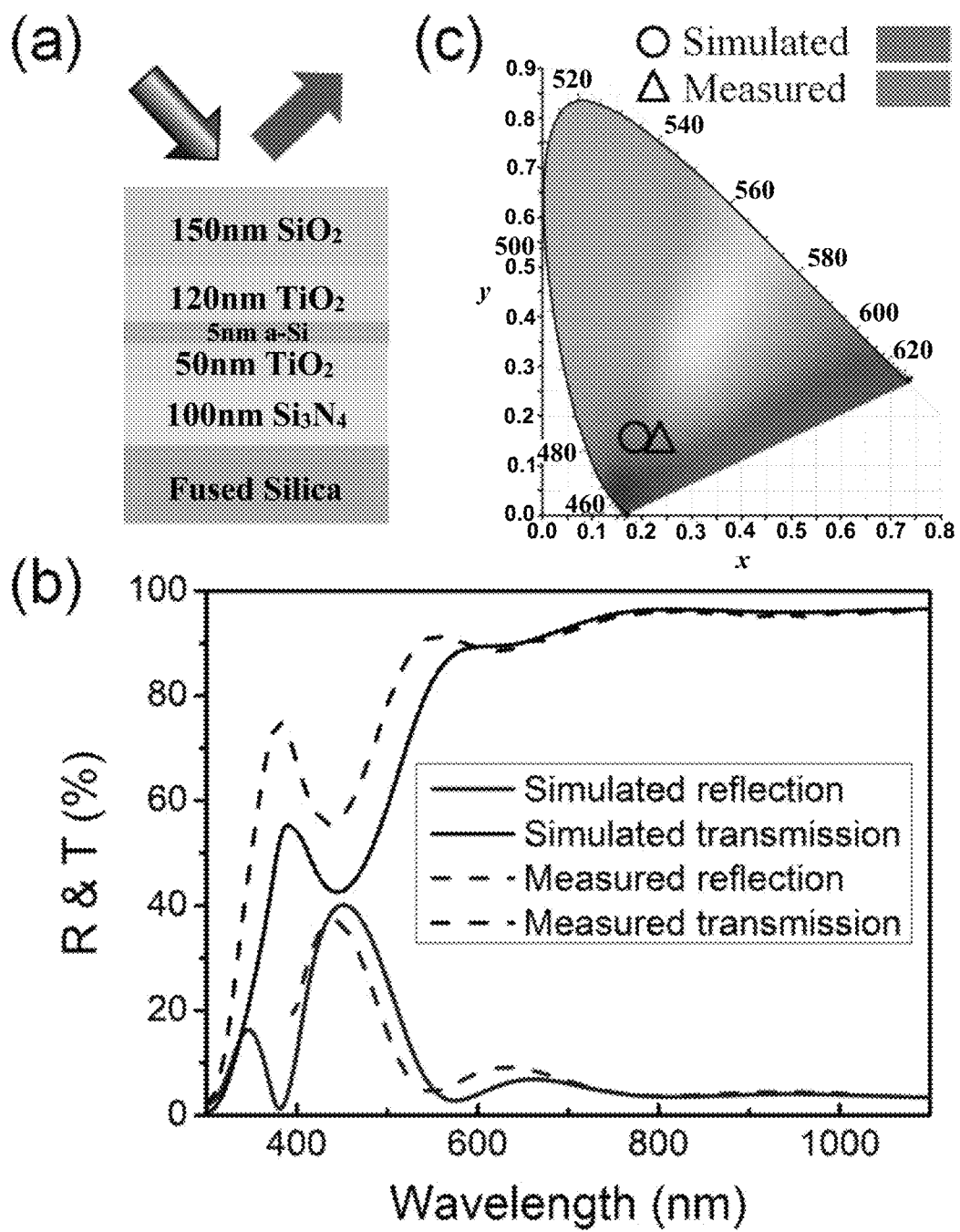

FIGS. 5A-5C. FIG. 5A shows a passive angle insensitive colored filter that reflects blue according to certain aspects of the present disclosure. The blue passive filter has a reflection peak intensity of about 40% at a wavelength of 451 nm for the silicon solar cell. FIG. 5B shows simulated and measured reflection and transmission spectra of the passive angle insensitive colored filter that reflects blue shown in FIG. 5A. FIG. 5C shows an illustration of the color coordinates from both the simulated and measured reflection spectra depicted on the CIE 1931 chromaticity diagram.

Figure 6:
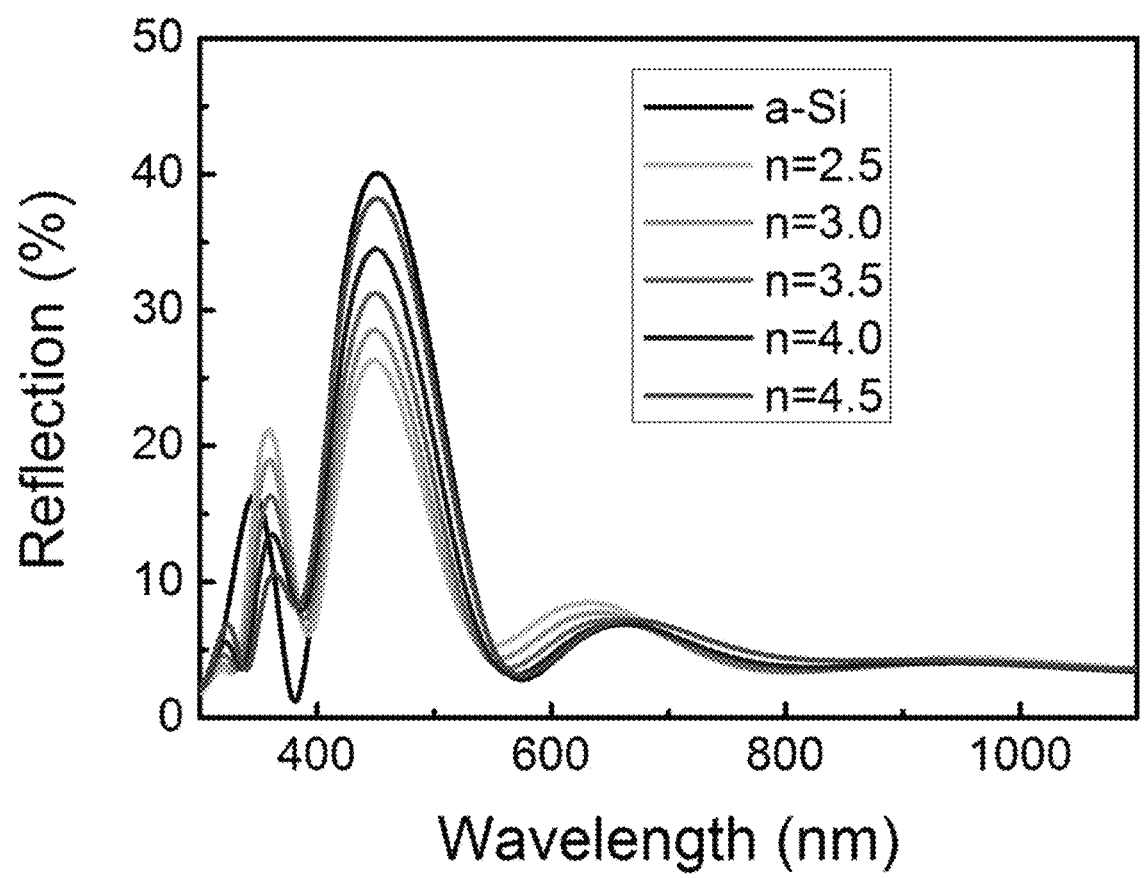

FIG. 6 illustrates a graphical representation of the reflection spectra of blue colored structures with a middle semiconductor layer of a-Si layer replaced by materials of different refractive indices ranging from 2.5-4.5.

Figures 7A, 7B, 7C, 7D:
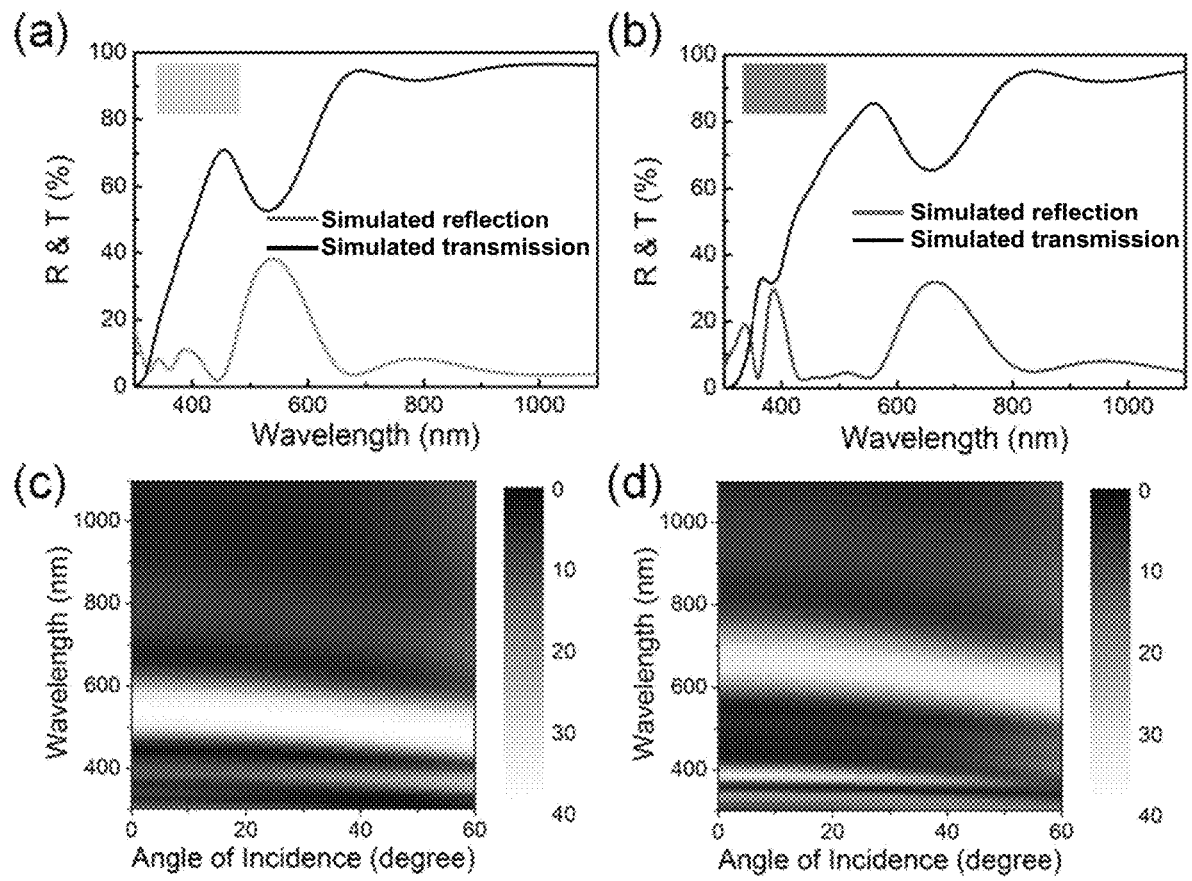

FIGS. 7A-7D. FIGS. 7A and 7B illustrate graphical representations of the simulated reflection and transmission spectra for the green and red passive filters, respectively.

FIGS. 7C and 7D show simulated angular behaviors of passive green and red filters, respectively.

Figure 8:
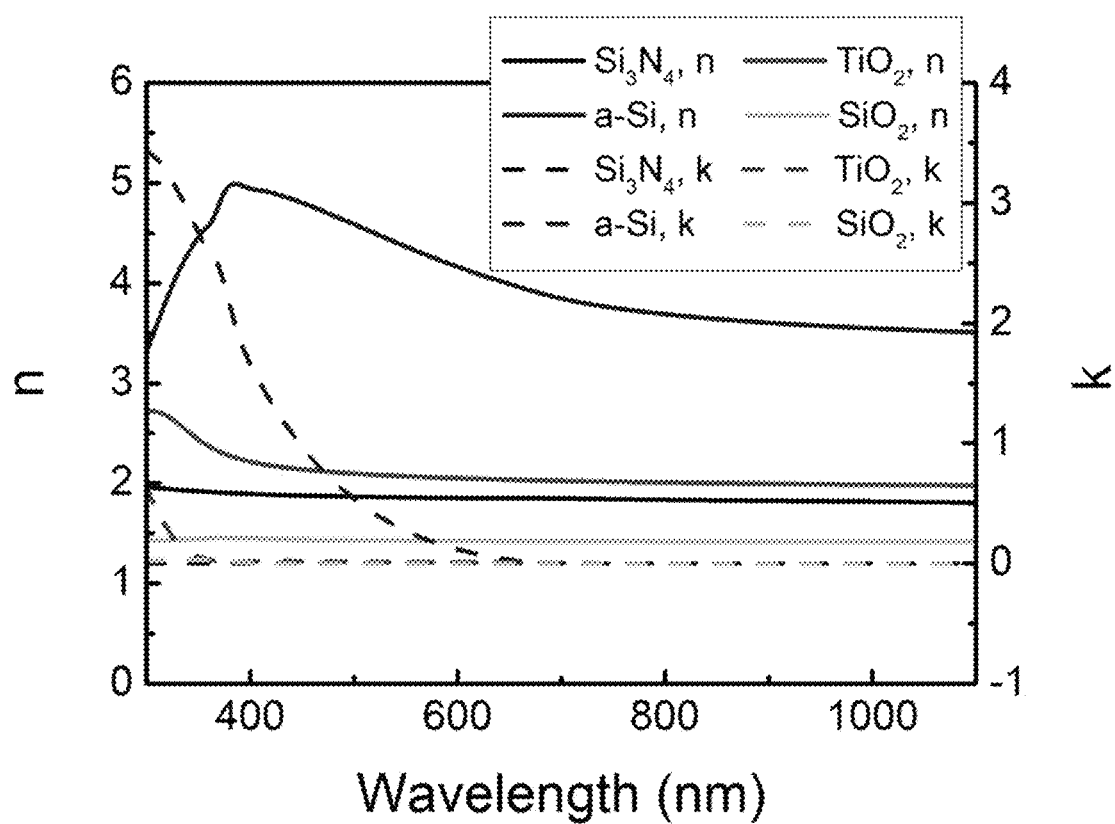

FIG. 8 illustrates a graphical representation of the refractive indices of $Si_3N_4$, $TiO_2$, a-Si, and $SiO_2$ dielectric materials using a spectroscopic ellipsometer (M-2000, J. A. Woollam).

Figures 9A, 9B, 9C:
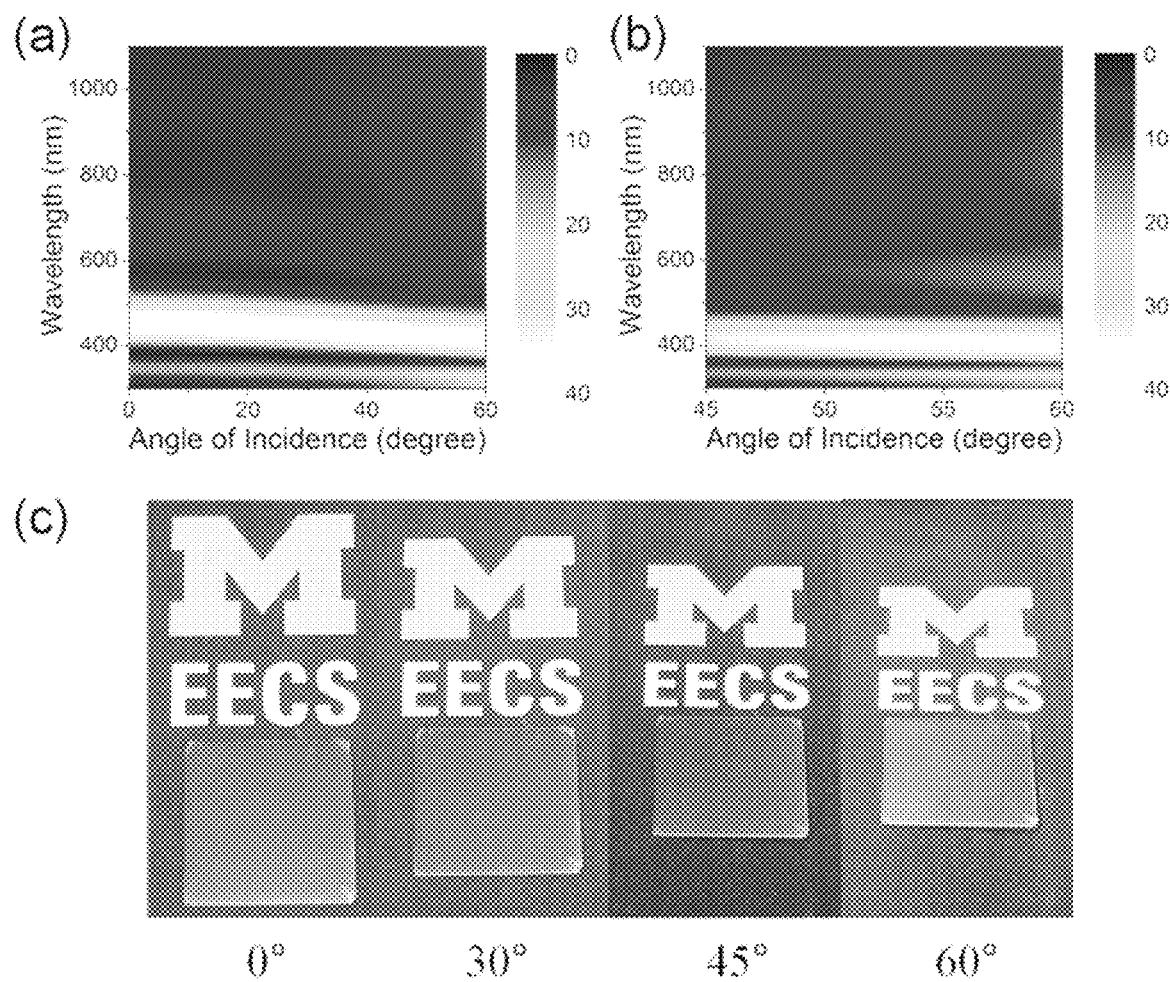

FIGS. 9A-9C. FIGS. 9A and 9B illustrate graphical representations of calculated and measured angle resolved reflection for a blue color filter prepared in accordance with certain aspects of the present disclosure under the unpolarized light illumination. FIG. 9C shows photographs of the fabricated blue color filter under ambient light illumination taken with a black background at four different viewing angles, showing that a stable blue color can be maintained over a wide angular range.

Figures 10A, 10B:
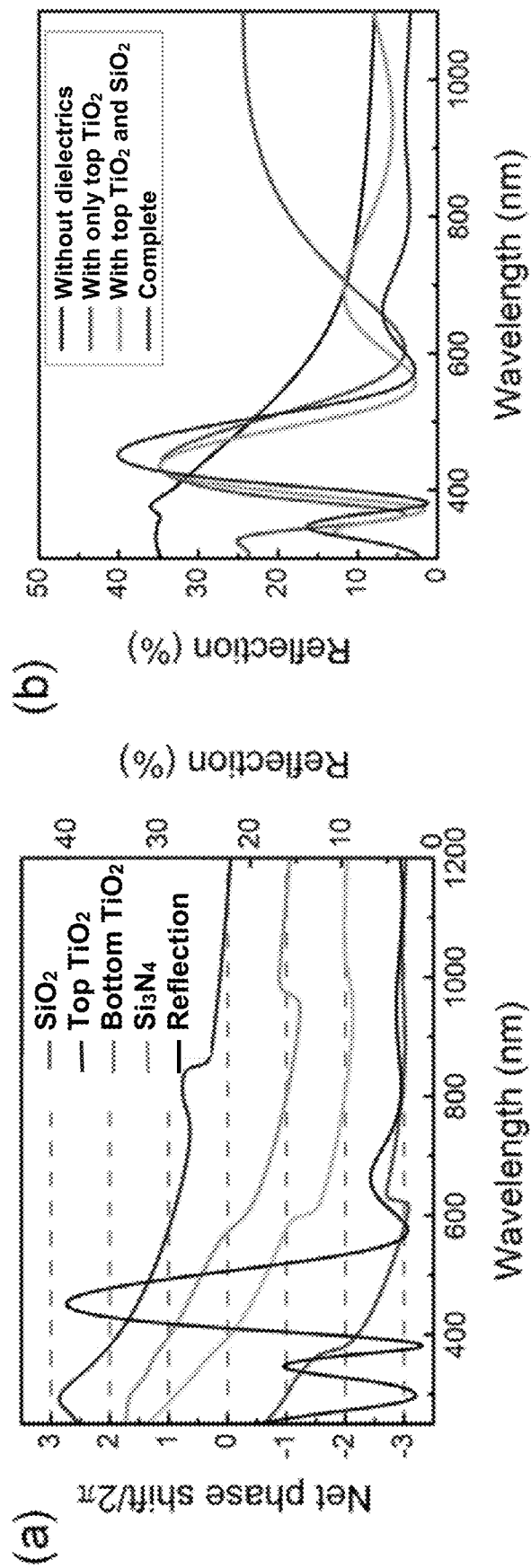

FIGS. 10A-10B. FIG. 10A illustrates a graphical representation of a calculated normalized total phase shift within each dielectric layer of a multilayer stack for a passive filter, indicating the positions of transmissive F-P resonances that results in the enhanced transmission. FIG. 10B shows a graphical representation of simulated reflection spectra of the filter structures by subsequently adding those 4 dielectric layers.

Figure 11:
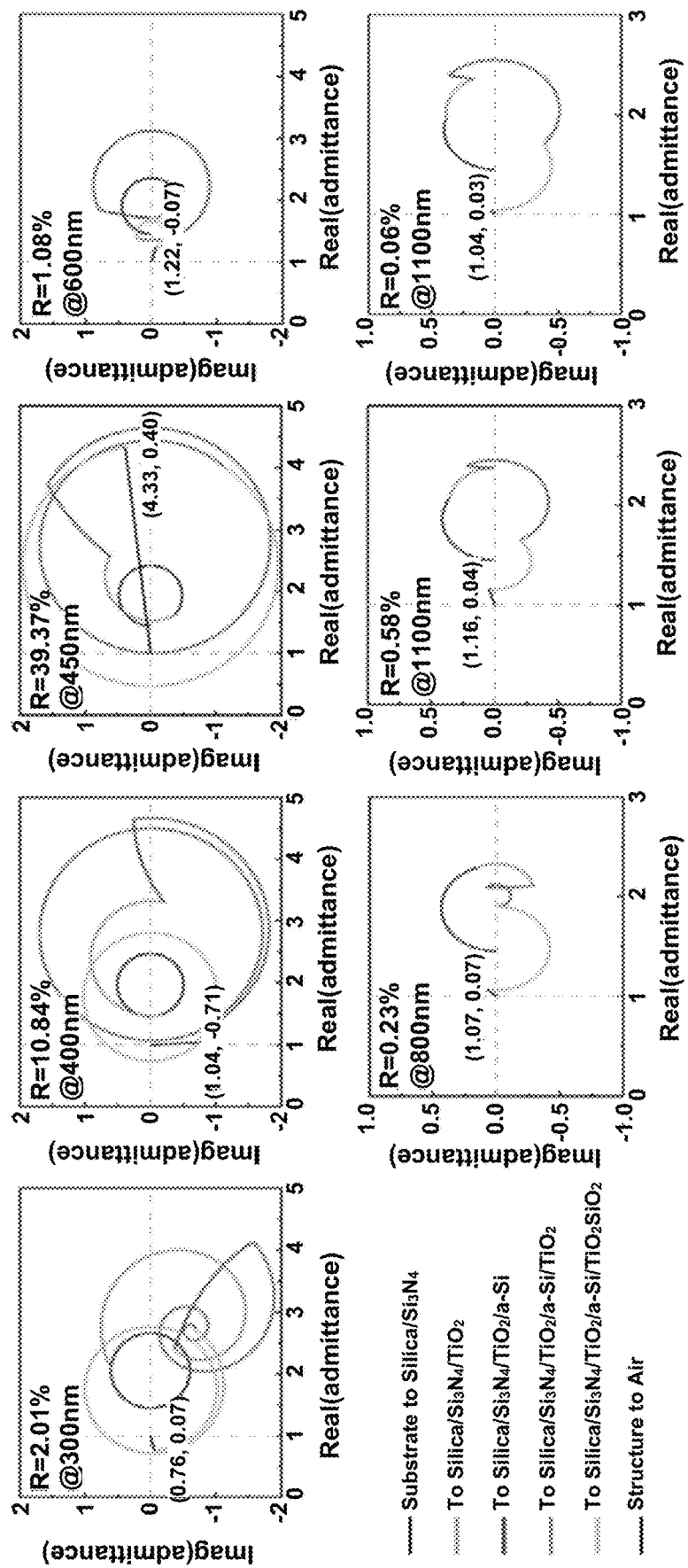

FIG. 11 illustrates optical admittance diagrams of an angle insensitive passive colored reflective filter according to certain aspects of the present disclosure at 300 nm, 400 nm, 450 nm, 600 nm, 800 nm, and 1000 nm wavelengths, respectively.

Figure 12:
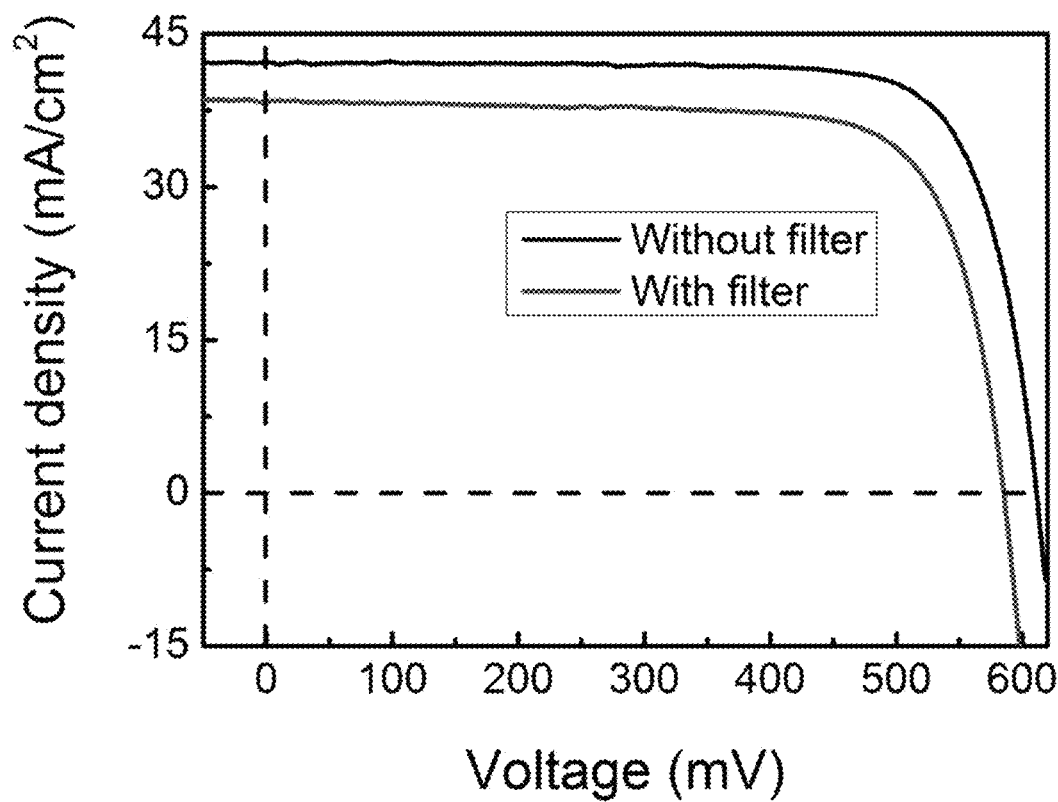

FIG. 12 illustrates a graphical representation of measured current density-voltage (J-V) characteristics of a photovoltaic device assembly incorporating a blue colored angle insensitive passive reflective filter under AM1.5 illumination (100 mWcm$^{-2}$) compared to that of the original c-Si photovoltaic cell without the reflective filter.

Figures 13A, 13B, 13C, 13D:
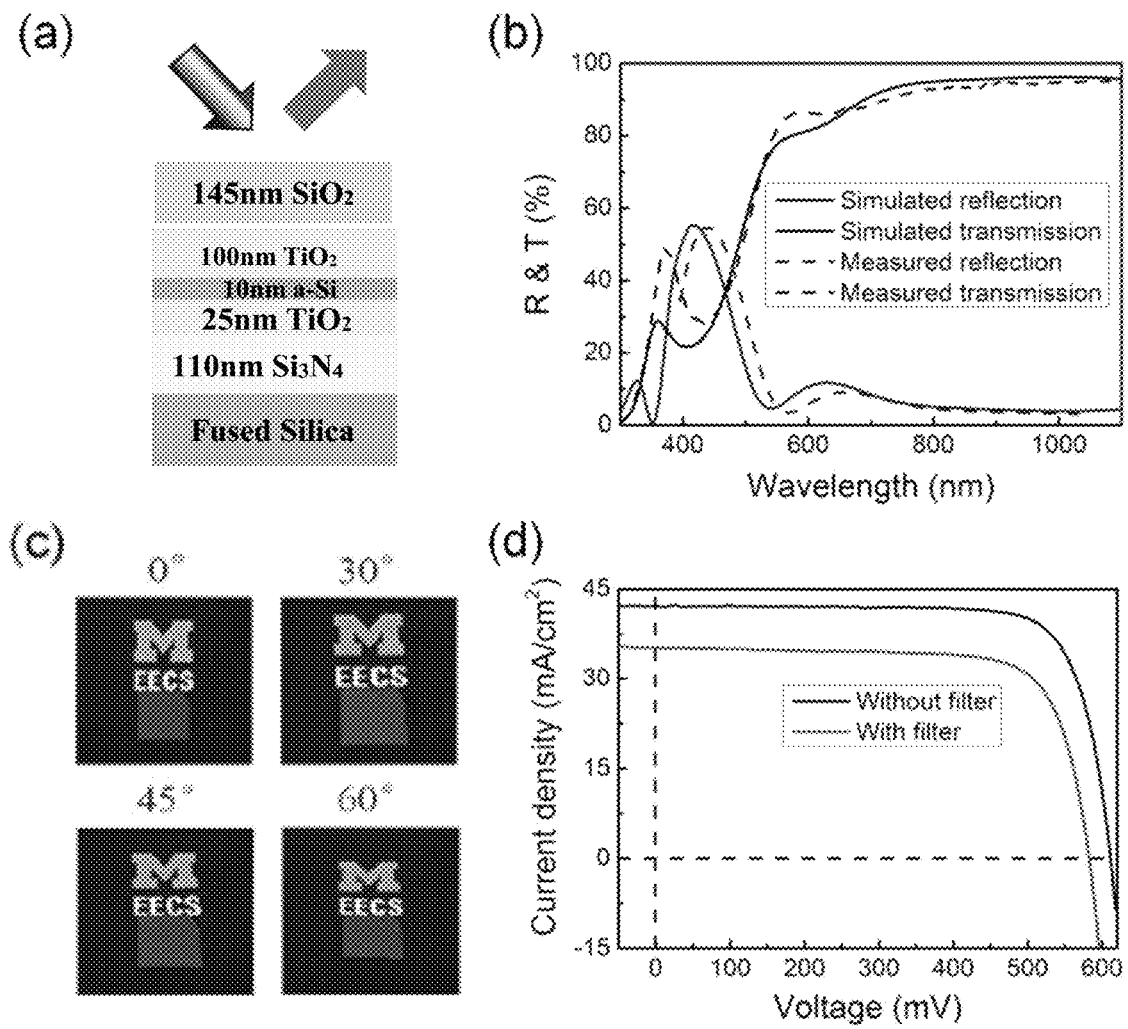

FIGS. 13A-13D. FIG. 13A illustrates a schematic diagram of a passive angle insensitive colored filter that reflects blue having enhanced reflection prepared according to certain aspects of the present disclosure. FIG. 13B shows reflection and transmission spectra of the new blue passive filter of FIG. 13A. FIG. 13C shows optical images of the fabricated samples at various viewing angles presenting great angular insensitivity. FIG. 13D shows measured J-V performance of an angle insensitive colored photovoltaic device assembly incorporating the blue colored reflective filter and a photovoltaic device under AM1.5 illumination compared to that of the original c-Si photovoltaic cell with no filter.

Figure 14A:
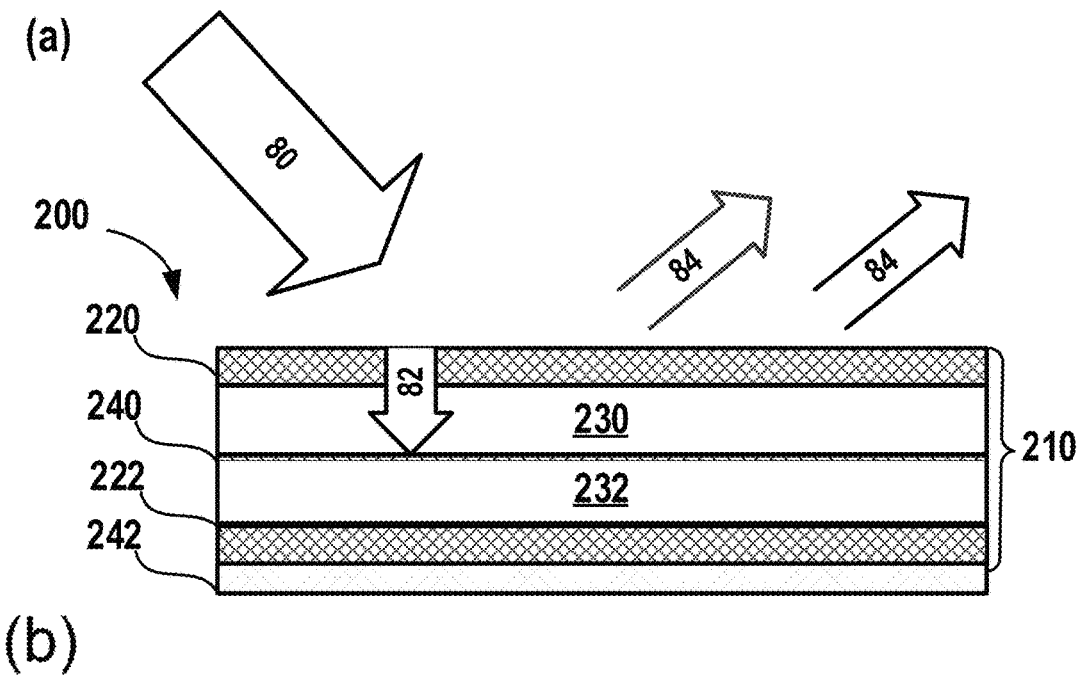
Figure 14B:
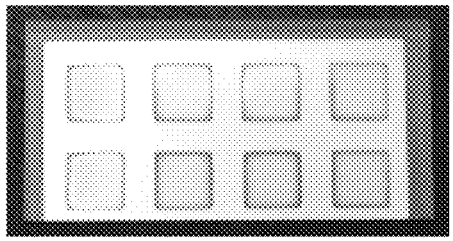
Figure 14C:
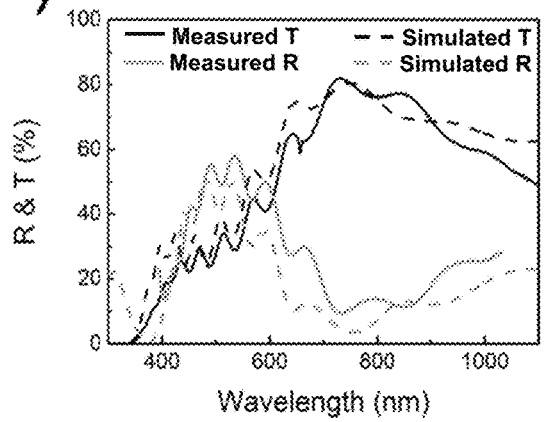
Figure 14D:
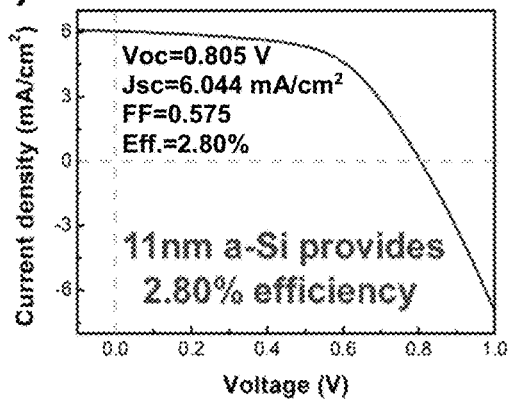

FIGS. 14A-14D show an active angle insensitive colored photovoltaic device assembly prepared in accordance with certain aspects of the present disclosure. FIG. 14A shows a sectional view of the active angle insensitive colored photovoltaic device assembly having an angle insensitive active colored reflective filter with an integrated photovoltaic device according to certain alternative aspects of the present disclosure. In FIG. 14B, pictures of a green colored solar cell is shown. FIGS. 14C-14D respectively show optical and electrical performance of the active angle insensitive colored photovoltaic device assembly.

Figure 15:
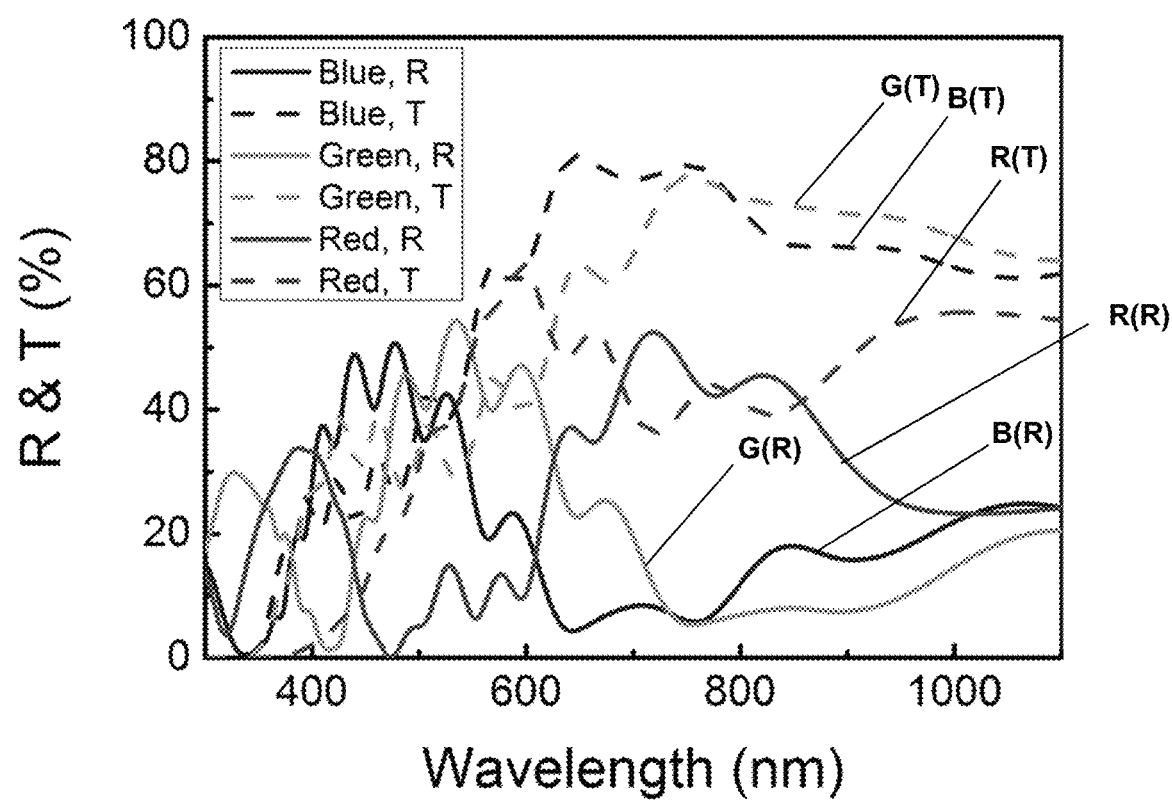

FIG. 15 shows simulated optical performance of an active angle insensitive photovoltaic device assembly comprising a-Si solar cells of different RGB colors prepared in accordance with certain aspects of the present disclosure.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

Unless otherwise indicated, compositions are given in mass/weight percentages.

In addition, disclosure of ranges includes disclosure of all values and further divided ranges within the entire range, including endpoints and sub-ranges given for the ranges.

Example embodiments will now be described more fully with reference to the accompanying drawings.

In various aspects, the present disclosure contemplates a highly efficient colored solar cell assembly, which includes both a passive reflective colored filter that is combined with a photovoltaic device. For example, as described herein, the present disclosure contemplates an angle insensitive colored photovoltaic device assembly that comprises a colored reflective filter and a photovoltaic device. As will be described further below, the photovoltaic device is adjacent to and optionally in contact with one side of the colored reflective filter.

Figure 1:
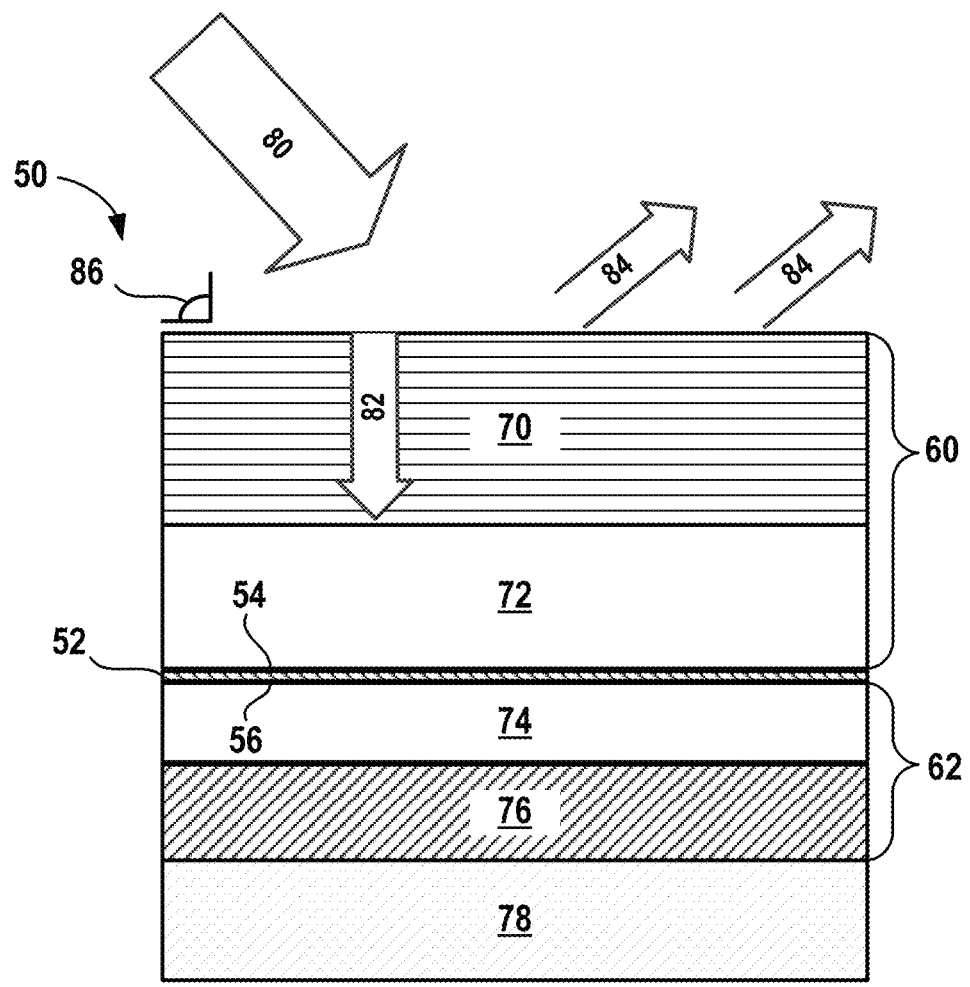
FIG. 1 is a sectional view of an angle insensitive passive colored reflective filter prepared in accordance with certain aspects of the present disclosure.

A passive angle insensitive colored filter 50 according to certain aspects of the present disclosure is shown in FIG. 1. The filter 50 has a plurality of layers that form a multilayered stack or assembly. The filter 50 thus includes an ultrathin reflective layer 52 that defines a first side 54 and a second side 56. The ultrathin reflective layer 52 may be a high refractive index material, a semiconductor material, or a metal layer. In certain aspects, the ultrathin reflective layer 52 comprises an amorphous silicon (a-Si) material. Amorphous silicon has a refractive index with the real part increasing from about 3.3 to about 5.0 when the wavelength increases from 300 nm to about 400 nm and decreasing from about 5.0 to about 3.5 when the wavelength increases from about 400 nm to 1100 nm, and the imaginary part decreasing from about 3.5 to 0 when the wavelength increases from 300 nm to 1100 nm. By "ultrathin," it is meant that the layer has a thickness of less than or equal to about 20 nm. In certain variations, the ultrathin reflective layer 52 has a thickness of less than or equal to about 15 nm. In certain variations, the ultrathin reflective layer 52 has a thickness of greater than or equal to about 5 nm to less than or equal to about 12 nm. In one aspect, the ultrathin reflective layer 52 has a thickness of greater than or equal to about 5 nm to less than or equal to about 10 nm. In another variation, the ultrathin reflective layer 52 has a thickness of greater than or equal to about 10 nm to less than or equal to about 12 nm.

The filter 50 includes a transparent first pair 60 of dielectric materials adjacent to the first side 54 of the ultrathin reflective layer 52. The first pair 60 comprises a first layer 70 of a dielectric material and a second layer 72 of a distinct dielectric material. The filter 50 also includes a transparent second pair 62 of dielectric materials adjacent to the second side 56 of the ultrathin reflective layer 52. The second pair 62 comprises a third layer 74 of a dielectric material and a fourth layer 76 of a distinct dielectric material. The second pair 62 of dielectric materials is disposed on a substrate 78. The substrate 78 may be formed of a material that is transparent to certain predetermined wavelengths of light, such as silica (e.g., fused silica or glass), quartz and polymers (e.g., polycarbonate, or acrylates). It should be noted that in alternative variations, additional layers or components may be included in the filter 50. By way of example, while not shown, an index-matching layer may be included on the side of the substrate 78 opposite to the fourth layer 76.

The dielectric materials for the layers 70-74 may each be independently selected from the group consisting of: silicon nitride ($Si_3N_4$), titanium oxide ($TiO_2$), and silicon dioxide ($SiO_2$), zinc oxide (ZnO), hafnium oxide ($HfO_2$), molybdenum trioxide ($MoO_3$), tantalum pentoxide ($Ta_2O_5$), niobium pentoxide ($Nb_2O_5$), oxide tungsten trioxide ($WO_3$), zinc selenide (ZnSe), zinc sulfide (ZnS), aluminum oxide ($Al_2O_3$), magnesium fluoride ($MgF_2$), and/or polymers with similar, suitable refractive indices. In one variation, the dielectric material selected to form each of the first layer 70, the second layer 72, the third layer 74, and the fourth layer 76 is independently selected from the group consisting of: silicon nitride ($Si_3N_4$), zinc selenide (ZnSe), titanium oxide ($TiO_2$), and silicon dioxide ($SiO_2$) In certain aspects, one or more of the layers 70-74 may be a high refractive index material, which may have a refractive index of greater than or equal to about 1.6, optionally greater than or equal to about 1.7, optionally greater than or equal to about 1.8, optionally greater than or equal to about 1.9, optionally greater than or equal to about 2, optionally greater than or equal to about 2.1, and in certain variations, optionally greater than or equal to about 2.2. Suitable high refractive index materials for use in accordance with the present disclosure include by way of non-limiting example, silicon nitride ($Si_3N_4$) having a refractive index of 2.0, titanium oxide ($TiO_2$) having a refractive index of about 2.2, and zinc selenide (ZnSe) has a refractive index of about 2.6.

Other contemplated high index materials are optical metamaterials. Metamaterials are synthetic materials engineered to have properties based on their structure, rather than composition of the material itself, by using small inhomogeneities to create effective macroscopic behavior, which are generally anisotropic and inhomogeneous. Many such optical metamaterials have high refractive indices or can be designed to have high refractive indices while still having minimal absorption in the target spectral range, for example metamaterials may a refractive index of greater than or equal to about 2; optionally greater than or equal to about 3, optionally greater than or equal to 3.5, optionally greater than or equal to about 4, and in certain aspects, optionally up to or exceeding a refractive index of 5. In certain additional embodiments described below, such metamaterials can be used in alternative optical filtering device embodiments to provide color filtering with minimal angle dependence.

In certain aspects, the first layer 70 comprises silicon dioxide ($SiO_2$), the second layer 72 comprises titanium oxide ($TiO_2$), the third layer 74 comprises titanium oxide ($TiO_2$), and the fourth layer 76 comprises silicon nitride ($Si_3N_4$). In certain other aspects, the first layer 70 comprises silicon nitride ($Si_3N_4$), the second layer 72 comprises zinc selenide (ZnSe), the third layer 74 comprises zinc selenide (ZnSe), and the fourth layer 76 comprises silicon nitride ($Si_3N_4$). In certain aspects, the first layer 70 has a thickness of greater than or equal to about 50 nm to less than or equal to about 300 nm and in certain variations, optionally greater than or equal to about 145 nm to less than or equal to about 245 nm. The second layer 72 may have a thickness of greater than or equal to about 10 nm to less than or equal to about 200 nm and in certain variations, optionally, greater than or equal to about 100 nm to less than or equal to about 195 nm. The third layer 74 may have a thickness of greater than or equal to about 10 nm to less than or equal to about 200 nm, and in certain variations, optionally greater than or equal to about 25 nm to less than or equal to about 75 nm. The fourth layer 76 has a thickness of greater than or equal to about 50 nm to less than or equal to about 300 nm, and in certain variations, optionally greater than or equal to about 100 nm to less than or equal to about 155 nm.

As shown in FIG. 1, an electromagnetic wave 80, such as sunlight, is directed towards the filter 50. In various aspects, the filter 50 is capable of transmitting a first portion of that electromagnetic wave 80 having a first range of predetermined wavelengths, shown at arrow 82. The filter 50 further reflects a second portion of the electromagnetic spectrum/electromagnetic wave 80 having a second range of predetermined wavelengths to generate a reflected output 84 that displays minimal angle dependence with respect to an incidence or viewing angle 86 from which the filter 50 may be viewed or observed (e.g., by a human or machine). As shown in FIG. 1, the viewing angle 86 is 90°, but may vary based on the position of observation to be anywhere from greater than 0° to less than 180° (e.g., ±90°).

A silicon photovoltaic panel responds to light with wavelengths roughly in a range of about 300 nm to 1100 nm. Particularly suitable ultraviolet, visible, and infrared electromagnetic radiation includes, ultraviolet radiation ranging from about 300 nm to about 390 nm, visible light having wavelengths ranging from about 390 to about 750 nm and infrared radiation (IR) (including near infrared (NIR) ranging from about 0.75 to about 1.4 µm). In the visible range of electromagnetic radiation, wavelengths in a range of about 625 nm to 740 nm are red; orange is at about 590 nm to about 625 nm; yellow is at about 565 nm to about 590 nm; green is at about 520 nm to about 565 nm; blue or cyan is at about 500 nm to about 520 nm; blue or indigo is at about 435 nm to about 500 nm; and violet is at about 380 nm to about 435 nm. Notably, as used herein, blue may encompass blue/cyan, blue/indigo, and violet.

In certain embodiments, the reflected output 84 has a predetermined range of wavelengths generated by the filter 50 in the visible light range that may include a color selected from the group consisting of: red, green, blue, and combinations thereof. In certain aspects, the reflected output 84 of electromagnetic radiation can have a wavelength in a range of greater than or equal to about 625 nm to less than or equal to about 740 nm for red; a range of greater than or equal to about 520 nm to less than or equal to about 565 nm for green; a range of greater than or equal to about 500 nm to less than or equal to about 520 nm for blue or cyan, and a range of greater than or equal to about 435 nm to less than or equal to about 500 nm for blue or indigo. Further, in certain aspects, the reflected light may be extra-spectral or a mixture of several different wavelengths. For example, magenta is an extra-spectral mixture of red (625 nm to 740 nm) and blue (435 nm to 500 nm) wavelengths.

In one variation, the angle insensitive colored filter 50 has reflected output 84 has a predetermined range of wavelengths corresponding to blue, where the ultrathin reflective layer 52 has a thickness of greater than or equal to about 5 nm to less than or equal to about 12 nm, the first layer 70 has a thickness of greater than or equal to about 50 nm to less than or equal to about 200 nm and optionally greater than or equal to about 145 nm to less than or equal to about 170 nm. The second layer 72 has a thickness of greater than or equal to about 10 nm to less than or equal to about 150 nm and optionally greater than or equal to about 100 nm to less than or equal to about 120 nm. The third layer 74 has a thickness of greater than or equal to about 10 nm to less than or equal to about 150 nm and optionally greater than or equal to about 25 nm to less than or equal to about 50 nm. The fourth layer 76 has a thickness of greater than or equal to about 10 nm to less than or equal to about 150 nm and optionally greater than or equal to about 100 nm to less than or equal to about 120 nm.

In certain other variations, the angle insensitive colored filter 50 has reflected output 84 has a predetermined range of wavelengths corresponding to green, where the ultrathin reflective layer 52 has a thickness of greater than or equal to about 5 nm to less than or equal to about 12 nm. The first layer 70 has a thickness of greater than or equal to about 100 nm to less than or equal to about 200 nm and optionally greater than or equal to about 185 nm to less than or equal to about 195 nm. The second layer 72 has a thickness of greater than or equal to about 10 nm to less than or equal to about 200 nm and optionally greater than or equal to about 145 nm to less than or equal to about 155 nm. The third layer 74 has a thickness of greater than or equal to about 10 nm to less than or equal to about 200 nm and optionally greater than or equal to about 35 nm to less than or equal to about 45 nm. The fourth layer 76 has a thickness of greater than or equal to about 100 nm to less than or equal to about 200 nm and optionally greater than or equal to about 135 nm to less than or equal to about 145 nm.

In yet other variations, the angle insensitive colored filter 50 has reflected output 84 has a predetermined range of wavelengths corresponding to red, where the ultrathin reflective layer 52 has a thickness of greater than or equal to about 5 nm to less than or equal to about 12 nm. The first layer 70 has a thickness of greater than or equal to about 100 nm to less than or equal to about 300 nm and optionally greater than or equal to about 235 nm to less than or equal to about 245 nm. The second layer 72 has a thickness of greater than or equal to about 10 nm to less than or equal to about 200 nm and optionally greater than or equal to about 185 nm to less than or equal to about 195 nm. The third layer 74 has a thickness of greater than or equal to about 10 nm to less than or equal to about 200 nm and optionally greater than or equal to about 65 nm to less than or equal to about 75 nm. The fourth layer 76 has a thickness of greater than or equal to about 100 nm to less than or equal to about 300 nm and optionally greater than or equal to about 145 nm to less than or equal to about 155 nm.

In certain aspects, the passive angle insensitive colored filter 50 exhibits minimal angle dependence, which corresponds to a reflected output 84 having a second predetermined range of wavelengths that varies less than or equal to about 80 nm; optionally less than or equal to 70 nm; optionally less than or equal to 60 nm when comparing a difference between a first wavelength at an incidence or viewing angle of 0° as compared to a second wavelength at an incidence angle of 60°. Minimal deviation of a reflected output can be expressed as minimal angle dependence. In certain particularly advantageous variations, the filter 50 has minimal angle dependence and is capable of generating a reflected output having a predetermined range of wavelengths (e.g., has a wavelength shift) that deviate less than or equal to 50 nm when the filter is observed from incidence angles ranging from 0 to 60°; optionally less than or equal to about 45 nm; optionally less than or equal to 40 nm; optionally less than or equal to 35 nm; optionally less than or equal to 30 nm; based on a range of incidence potential angles (when comparing a difference between a first wavelength of interest observed at an incidence angle of 0° as compared to a second wavelength observed at an incidence or viewing angle of 60°). In certain aspects, the passive angle insensitive colored filter 50 has a non-iridescent appearance with minimal wavelength variation described above up to ±60°.

Figure 2:
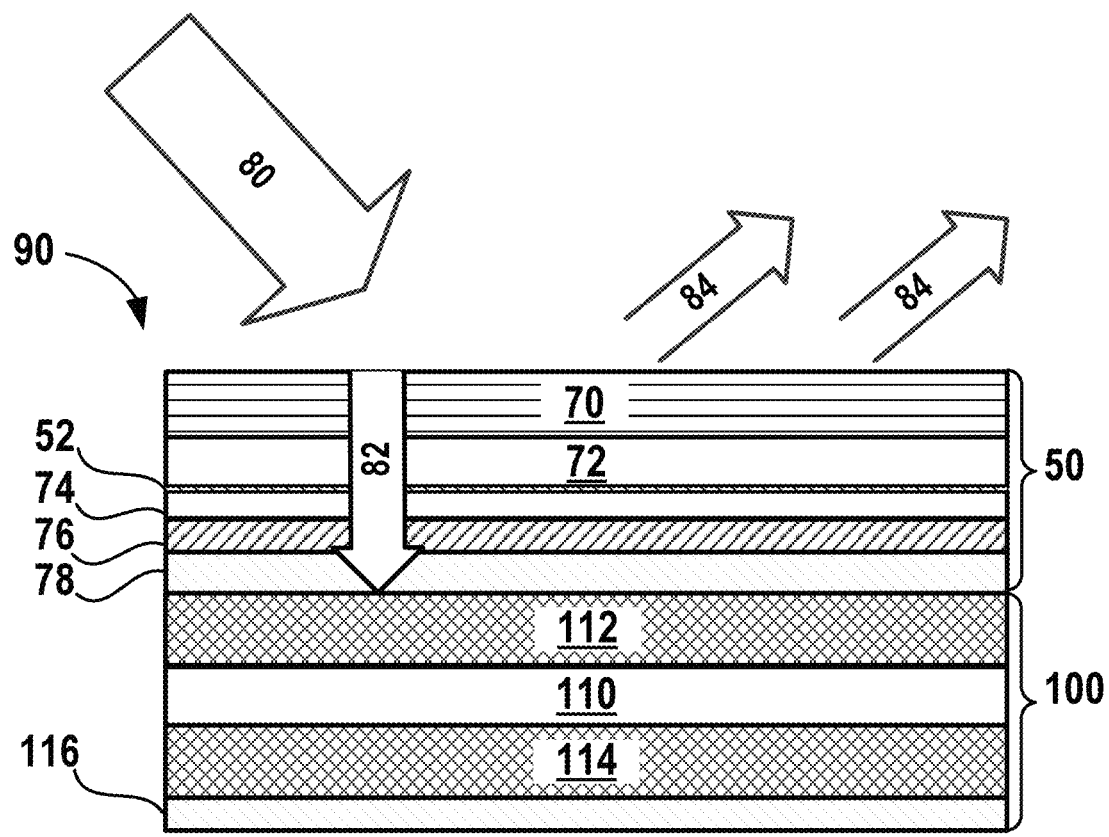
FIG. 2 is a sectional view of an angle insensitive colored photovoltaic device assembly incorporating the angle insensitive passive colored reflective filter of FIG. 1 and an integrated photovoltaic device according to certain aspects of the present disclosure.

FIG. 2 shows an angle insensitive colored photovoltaic device assembly 90 that comprises a colored reflective filter 50 as in FIG. 1 together with a photovoltaic assembly 100. For brevity, the features and details described above in the context of FIG. 1 will not be repeated herein. The exemplary photovoltaic device assembly 100 has a photovoltaic cell 110 that may be include a photoactive material layer. In certain variations, the at least one photoactive layer 114 includes a crystalline silicon (c-Si) material. The photovoltaic cell may thus comprise a crystalline silicon (c-Si) panel, a back contact type of photovoltaic cell, or a photovoltaic cell having a first electrode with a first polarity, a second electrode having an opposite polarity from the first electrode, and at least one photoactive material layer (e.g., comprising c-Si) disposed between the first electrode and the second electrode. The photovoltaic assembly 100 may also include additional layers sandwiching the photovoltaic cell 110, such as protective or encapsulating layers. Thus, a first layer 112 of the photovoltaic assembly 100 is disposed between the substrate 78 of the colored reflective filter 50 and the photovoltaic cell 110, while on an opposite side of the photovoltaic cell there is a second layer 114. The second layer 114 is disposed on a backsheet 116. The first and second layers may be formed of materials that are transparent to light having a predetermined range of wavelengths that desirably enter the photovoltaic cell 110, such as ethylene-vinyl acetate (EVA), by way of example. The backsheet 116 may be formed of materials such as polyethylene terephthalate (PET), aluminum, and the like. It should be noted that while not shown, additional types of photovoltaic devices, including other layers or components may be included in the exemplary photovoltaic assembly 100.

As noted in the context of FIG. 1, the filter 50 is capable of transmitting a first portion of the electromagnetic wave 80 having a first range of predetermined wavelengths directed towards the angle insensitive colored photovoltaic device assembly 90. The transmitted electromagnetic energy is shown at arrow 82. Thus, the transmitted electromagnetic energy 82 passes through the filter 50 and enters the photovoltaic device 100. As noted above, the filter 50 reflects the second portion of the electromagnetic spectrum/electromagnetic wave 80 having a second range of predetermined wavelengths to generate a reflected output 84. Because a large portion of the transmitted electromagnetic energy 82 enters the photovoltaic device 100, the angle insensitive colored photovoltaic device assembly 90 can produce a power conversion efficiency (PCE) of greater than or equal to about 15%, optionally greater than or equal to about 16%, optionally greater than or equal to about 17%, and in certain aspects, optionally greater than or equal to about 18%.

As such, in certain variations, the present disclosure provides an assembly that comprises a PV device that may include a crystalline silicon (c-Si) PV panel and a passive colored filter having a new tandem configuration that exhibits angle insensitivity, while reflecting a desirable color or colors for decorate or aesthetic appeal. The passive reflective filter can include five layers, as discussed above, where a semiconductor (e.g., a-Si) may be sandwiched between two pairs/stacks of transparent dielectrics, which can transmit a large portion of solar spectrum to be harvested by the c-Si PV module beneath by adopting a gradient index profile, thus achieving the overall high efficiency. In this manner, an angular robust/insensitive colored solar cell/photovoltaic device assembly is provided with high efficiency (e.g., greater than or equal to about 18% in certain variations) by integrating a crystal silicon (c-Si) solar panel/PV device with a passive colored filter disposed atop the PV device. Moreover, due to the high refractive index of the semiconductor layer (e.g., a-Si) involved in the colored filter module, the angle insensitive colored photovoltaic device assembly exhibits a non-iridescent appearance up to ±60° having great brightness (approximately 55% peak reflection).

The present disclosure thus provides a passive angle insensitive photovoltaic device assembly that includes a passive angle insensitive colored filter having a significantly reduced amount of layers as compared to one dimensional (1D) photonic crystals (PCs), which typically include at least ten distinct layers, while also overcoming the angular sensitivity and low efficiency issues of typical colored solar cells. In this manner, the present passive angle insensitive photovoltaic device assemblies have great potential for a variety of applications that may employ photovoltaic devices, including construction, automotive, marine, aeronautical, and agricultural industries, including solar-harvesting surfaces/coatings, innovative solar buildings/building-integrated photovoltaics (BIPVs), and solar-powered vehicles (e.g., automobiles, motorcycles, boats). The present technology can be implemented on a large scale and readily applied for mass-production.

Figure 3:
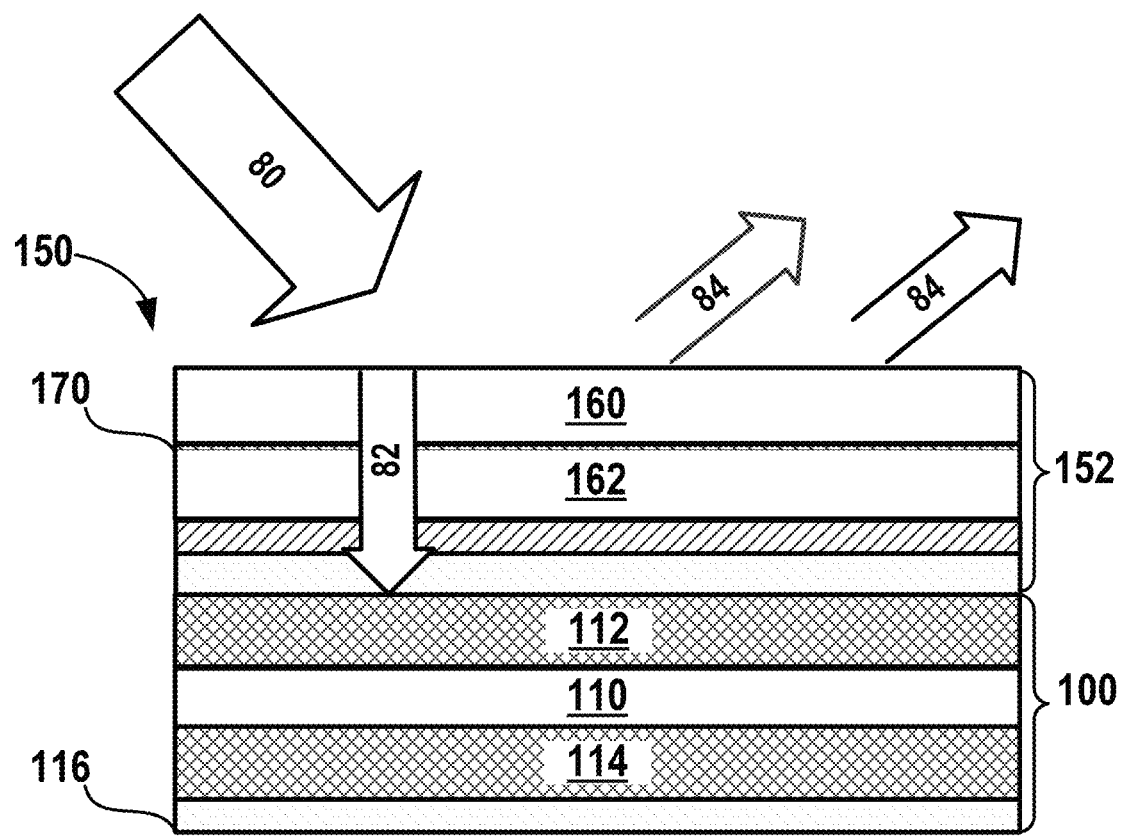
FIG. 3 is a sectional view of an angle insensitive colored photovoltaic device assembly incorporating an angle insensitive active colored reflective filter and an integrated photovoltaic device according to certain alternative aspects of the present disclosure.

In certain alternative variations like that shown in FIG. 3, an angle insensitive colored photovoltaic device assembly 150 is shown that comprises an active colored reflective assembly 152 with a photovoltaic device 100 (like that shown in FIG. 2). For brevity, the features and details described above in the context of FIG. 2 will not be repeated herein where they are common. The exemplary photovoltaic device assembly 100 has the photovoltaic cell 110, which while not shown, may have a first electrode with a first polarity, a second electrode having an opposite polarity from the first electrode, and at least one photoactive material layer (e.g., comprising c-Si) disposed between the first electrode and the second electrode, by way of non-limiting example. The first layer 112 and the second layer 114 sandwich the photovoltaic cell 110. The second layer is disposed on the backsheet 116 as described previously in the context of FIG. 2. The active colored reflective assembly 152 has been adapted from the passive angle insensitive colored filter 50 to replace at least some of the dielectric materials with transparent electrodes. Thus, the active colored reflective assembly 152 has a third electrode 160 with a third polarity and a fourth electrode 162 with a fourth polarity opposite to the third polarity. An ultrathin reflective layer 170 is disposed between the third electrode 160 and the fourth electrode 162. The ultrathin reflective layer 170 may be a semiconductor and may have a high refractive index, for example, comprising an amorphous silicon (a-Si) material. The third electrode 160 and the fourth electrode 162 may be formed of electrically conductive and transparent materials, such as indium tin oxide (ITO) and indium zinc oxide (IZO). It should be noted that while not shown, additional layers or components (e.g., such as terminals) may be included in the exemplary angle insensitive colored photovoltaic device assembly 150.

As noted in the context of FIGS. 1 and 2, the angle insensitive colored photovoltaic device assembly 150 is capable of transmitting a first portion of the electromagnetic wave 80 having a first range of predetermined wavelengths that is directed towards the photovoltaic device assembly 150. The transmitted electromagnetic energy is shown at arrow 82. Thus, the transmitted electromagnetic energy 82 passes through the active colored reflective assembly 152 and enters the photovoltaic device 100. Like previous embodiments, the active colored reflective assembly 152 reflects the second portion of the electromagnetic spectrum/electromagnetic wave 80 having a second range of predetermined wavelengths to generate a reflected output 84 having the properties described above, including angle insensitivity and brightness. In this manner, in certain embodiments, the angle insensitive colored photovoltaic device assembly 150 having a design with the first electrode (not shown), the second electrode (not shown), the third electrode 160, and the fourth electrode 162 can form a four-terminal photovoltaic device (terminals not shown, but in electrical connection with each respective electrode) that generates additional conversion of photons to current in both the active colored reflective assembly 152 and in the photovoltaic device 100. This angle insensitive colored photovoltaic device assembly 150 thus exhibits angle insensitivity and reflectivity of predetermined colors, but is believed to be capable of further enhancing the PCE of the photovoltaic device assembly 150 beyond those described in the context of the angle insensitive colored photovoltaic device assembly 90 incorporating the passive angle insensitive colored filter 50.

In another variation shown in FIG. 14A, an angle insensitive colored photovoltaic device assembly 200 comprises an active colored reflective assembly 210 that defines both a filter and a photovoltaic device. For brevity, the features and details described above in the context of FIGS. 1-3 will not be repeated herein where they are common. The exemplary photovoltaic device assembly 200 has a first electrode 220 with a first polarity, a second electrode 222 having an opposite polarity from the first electrode 220. A first doped layer 230 is a charge transport layer that serves as an electron hole transport layer disposed adjacent to the first electrode 220, while a second doped layer 232 is a charge transport layer that serves as an electron transport layer disposed adjacent to the second electrode 222.

The first electrode 220 and the second electrode 222 may be formed of a transparent conductive material, such as aluminum doped zinc oxide (AZO), indium tin oxide (ITO), indium zinc oxide (IZO), magnesium and gallium co-doped zinc oxide (MGZO), boron doped zinc oxide (BZO), combinations thereof, and the like. In one variation, the first electrode 220 comprises indium tin oxide (ITO), which may be formed via an e-beam deposition process. The second electrode 222 may be formed of an aluminum doped zinc oxide (AZO). Aluminum doped zinc oxide (AZO) and indium tin oxide (ITO) can thus be employed as anode and cathode, respectively, due to their transparency and compatibility with corresponding interfacial layers. While not shown, it should be noted that other transparent electrodes, including magnesium and gallium co-doped zinc oxide (MGZO), boron doped zinc oxide (BZO), and the like can also be used if additional suitable transport layers are employed.

As noted above, the first doped layer 230 may be a charge (e.g., an electron) transport layer. For example, the first doped layer 230 may be a doped n-type silicon-based material, such as n-type silicon oxide ($SiO_x$). By way of example, the doped n-type silicon oxide may be created by including a dopant atom having one or more electrons in its outer level than silicon has, such as phosphorus (P), in a silicon oxide ($SiO_x$) material. This electron is donated upon excitation. As shown, the first doped layer 230 is a single layer, although it may have multiple layers. In one variation, the first doped layer 230 comprising a $n-SiO_x$ may have a thickness of about 15 nm.

The second doped layer 232 may be a charge (e.g., a hole) transport layer. For example, the second doped layer 232 may be a doped p-type silicon-based material, such as p-type silicon oxide ($SiO_x$). By way of example, the doped p-type silicon oxide may be created by including a dopant atom having one or more electrons fewer in its outer level than silicon has, such as boron (B) or gallium (Ga), in a silicon oxide ($SiO_x$) material. Because the dopants have at least one less electron than is required to form bonds with the surrounding silicon atoms, an electron vacancy or positively charged hole is created upon excitation. As shown, the second doped layer 232 is a single layer, although it may have multiple layers. In one variation, the second doped layer 232 comprising a p-SiO$_x$ may have a thickness of about 10 nm.

An ultrathin reflective layer 240 is disposed between the first doped layer 230 and the second doped layer 232. The ultrathin reflective layer 240 may be a semiconductor and may have a high refractive index, for example, comprising an amorphous silicon (a-Si) material. The ultrathin reflective layer 240 may be formed of the materials and have any of the thicknesses described above. In one example, the ultrathin reflective layer 240 comprises amorphous silicon (a-Si) and may be about 11 nm thick.

In this manner, the first electrode 220, first doped layer 230, ultrathin reflective layer 240, second doped layer 232, and second electrode 222 define the active colored reflective assembly 210 that includes a photovoltaic cell, so as to define the angle insensitive colored photovoltaic device assembly 200. The second electrode 222 is disposed on a substrate or backsheet 242 as described previously in the context of FIG. 2. The backsheet 242 may be formed of a glass material, by way of example. The active colored reflective assembly 210 has been adapted from the passive angle insensitive colored filter 50 to replace at least some of the dielectric materials with transparent electrodes and either n-doped or p-doped layers.

It should be noted that while not shown, additional layers or components (e.g., such as terminals) may be included in the exemplary angle insensitive colored photovoltaic device assembly 200.

As noted in the context of FIGS. 1-3, the active angle insensitive colored photovoltaic device assembly 200 is capable of transmitting a first portion of the electromagnetic wave 80 having a first range of predetermined wavelengths that is directed towards the photovoltaic device assembly 200. The transmitted electromagnetic energy is shown at arrow 82. Thus, the transmitted electromagnetic energy 82 passes through and into the active colored reflective assembly 210 that defines the photovoltaic device. Like previous embodiments, the active colored reflective assembly 210 reflects the second portion of the electromagnetic spectrum/electromagnetic wave 80 having a second range of predetermined wavelengths to generate a reflected output 84 having the properties described above, including angle insensitivity and brightness. In this manner, in certain embodiments, the active angle insensitive colored photovoltaic device assembly 200 having a design with the first electrode 220 and the second electrode 222 defines a photovoltaic device (terminals not shown, but in electrical connection with each respective electrode) that generates additional conversion of photons to current in the active colored reflective assembly/photovoltaic device 210. This active angle insensitive colored photovoltaic device assembly 210 thus exhibits angle insensitivity and reflectivity of predetermined colors, but is also capable of enhancing the PCE of the integral photovoltaic device assembly or an ancillary photovoltaic assembly beyond those described in the context of the angle insensitive colored photovoltaic device assembly that has a passive angle insensitive colored filter. Thus, an angle insensitive colored photovoltaic device assembly 200 comprises an active colored reflective assembly 210 that may be coupled with another photovoltaic device disposed below the active colored reflective assembly 210 (such as shown in FIG. 3, for example).

Where the angle insensitive colored photovoltaic device assembly 200 comprises an active colored reflective assembly 210, the dielectric material pairs (e.g., ZnSe and Si$_3$N$_4$) are substituted with suitable hole/electron transport layers and transparent electrodes, such that the devices can be adapted in active solar cells. Here, the first doped layer 230 and second doped layer 232 (i.e., n- and p-SiO$_x$ as electron and hole transport layers, respectively) are selected considering their substantially perfect band alignment with the a-Si in the ultrathin reflective layer 240. Aluminum doped zinc oxide (AZO) and indium tin oxide (ITO) are employed are the transparent anode (e.g., first electrode 220) and cathode (e.g., second electrode 222), respectively, due to their transparency and compatibility with corresponding interfacial layers. The thickness of each layer is carefully selected for optimal electrical performance.

By way of non-limiting example, the first electrode 220 may have a thickness of greater than or equal to about 50 nm to less than or equal to about 200 nm, optionally greater than or equal to about 75 nm to less than or equal to about 170 nm. The second electrode 222 may have a thickness of greater than or equal to about 750 nm to less than or equal to about 1,500 nm (1.5 µm), optionally about 1,000 nm (1 µm). A first doped layer 230 or transport layer may have a thickness of greater than or equal to about 10 nm to less than or equal to about 20 nm, optionally greater than or equal to about 15 nm to less than or equal to about 19 nm. A second doped layer 232 or transport layer may have a thickness of greater than or equal to about 5 nm to less than or equal to about 20 nm, optionally greater than or equal to about 10 nm to less than or equal to about 19 nm. The ultrathin reflective layer 240 may have a thickness of greater than or equal to about 5 nm to less than or equal to about 55 nm, optionally greater than or equal to about 10 nm to less than or equal to about 55 nm, and optionally greater than or equal to about 10 nm to less than or equal to about 13 nm.

In one variation, the e-beam deposited ITO first electrode 220 having a thickness of about 75 nm, the first doped layer 230 with n-SiO$_x$ having a thickness of about 15 nm, the ultrathin reflective layer 240 of a-Si having a thickness of about 11 nm, the second doped layer 232 with p-SiO$_x$, the second electrode 222 having a thickness of about 1 micrometer, as shown in FIG. 14A.

Various embodiments of the inventive technology can be further understood by the specific examples contained herein. Specific Examples are provided for illustrative purposes of how to make and use the compositions, devices, and methods according to the present teachings and, unless explicitly stated otherwise, are not intended to be a representation that given embodiments of this invention have, or have not, been made or tested.

Examples

A passive angle insensitive colored filter is fabricated by depositing layers on a fused silica substrate. TiO$_2$ is deposited by e-beam evaporation at the room temperature at a rate of 3.0 Å/s. Si$_3$N$_4$, a-Si, and SiO$_2$ are deposited with plasma-enhanced chemical vapor deposition (PECVD) at a rate of 4.0 Å/s, 0.7 Å/s, and 7.0 Å/s at the temperature of 260° C., 260° C., and 200° C., respectively.

Optical simulations for calculating the spectral reflection and transmission, angle-resolved spectra, electrical field intensity distributions, and the net phase shift within each dielectric layer are based on the transfer matrix method with the refractive indices of materials calibrated using a spectroscopic ellipsometer (M-2000, J. A. Woollam).

Optical and electrical characterizations are conducted as follows. The reflection spectrum at the normal incidence is obtained with a thin-film measurement instrument (F20, Filmetrics) integrated with a spectrometer and a white light source. The measurements of angle-resolved reflection spectra from 45° to 60° as well as the transmission spectrum at the normal incidence are conducted with the spectroscopic ellipsometer (M-2000, J. A. Woollam).

Aluminum foil is used to cover a surface of a commercial back contact c-Si solar panel (about 125 mm square, MAXEON®, Sunpower Corporation), leaving a 22 $mm^2$ opening at the center for the 25 mm square passive filters. Then the current density-voltage (J-V) performance of the integrated colored solar cell is recorded under the illumination of AM1.5 simulated sunlight (100 $mWcm^{-2}$) by connecting MP-160 (EKO Instruments) to electrodes (a detailed setup is shown in FIG. 4).

FIGS. 5A-5D show an angle-robust passive filter according to certain aspects of the present disclosure and its performance. The angle insensitive passive filter is able to generate a distinct reflection color of blue, as well as overall high transmission employing the optical interference within simply 5 thin layers. As shown in FIG. 5A, an ultra-thin a-Si layer (about 5 nm) is sandwiched between two stacks or pairs of layers of transparent dielectrics (silicon nitride ($Si_3N_4$)/titanium dioxide ($TiO_2$) and $TiO_2$/silicon dioxide ($SiO_2$)) forming a graded index profile. This design results in remarkable transmission across the whole solar spectrum to be harvested by a photovoltaic device incorporating a crystalline silicon (c-Si) photoactive layer beneath (as shown in FIG. 5B)). The high index of a-Si utilized in the angle insensitive passive filter directly contributes to the final strong reflection of designed color with the peak reflection approximately 40% at 452 nm, which is further described in FIG. 6.

FIG. 6 compares reflection spectra of structures employing materials of different refractive indices as the middle layer. Here, the blue color is used as an example for clarifying the working principles and the corresponding thicknesses of $Si_3N_4$, bottom $TiO_2$, top $TiO_2$, and $SiO_2$ are 100 nm, 50 nm, 120 nm, and 150 nm, respectively. Alternatively, green and red reflected outputs can be achieved with ease by adjusting the thicknesses of these 4 dielectric layers, while maintaining the a-Si thickness as 5 nm.

The thicknesses of the remaining layers in the multilayer stack remain the same in each case. The dispersion of all those materials has been ignored, except for a-Si (n=4.80+ i0.95, peak intensity about 40% at 452 nm). It is clear that the peak reflection intensity remains at about 450 nm and increases with the refractive index: 26% at 449 nm (n=2.5), 29% at 449 nm (n=3.0), 31% at 450 nm (n=3.5), 35% at 450 nm (n=4.0), 38% at 451 nm (n=4.5), thus validating that the high reflection is due to the high index of the middle layer.

The thicknesses of the various dielectric layers in the passive filter structure for each RGB color are listed in Table 1.

TABLE 1

| Filter Color | $Si_3N_4$ Thickness (nm) | $TiO_2$ Thickness (nm) | a-Si Thickness (nm) | $TiO_2$ Thickness (nm) | $SiO_2$ Thickness (nm) |
|---|---|---|---|---|---|
| Blue | 100 | 50 | 5 | 120 | 150 |
| Green | 140 | 40 | 5 | 150 | 190 |
| Red | 150 | 70 | 5 | 190 | 240 |

FIGS. 7A-7D provide simulated reflection and transmission spectra, as well as simulated angular behaviors, for filters reflecting the green (FIGS. 7A and 7C) and red colors (FIGS. 7B and 7D). Considering that the high index ultrathin a-Si semiconductor layer is the main factor for the reflection peak and the real part refractive index of a-Si decreases at longer wavelengths, the peak reflection intensity are correspondingly smaller for the green (37% at 538 nm) and red (32% at 666 nm) colors when the a-Si is fixed at a thickness of 5 nm. Insets are the visualized reflective colors for each filter, presenting distinct green and red colors. The dimensions of each layer are outlined in Table 1. In FIGS. 7C and 7D, simulated angular behaviors of green and red filters are shown, where the flat dispersion spectra indicate the great angular-robust performance required for the decorative applications.

The refractive indices of all the materials (a-Si, $Si_3N_4$, $TiO_2$, and $SiO_2$) are characterized by using a spectroscopic ellipsometer (M-2000, J. A. Woollam) and provided in FIG. 8.

Excellent consistency between the simulated and measured results can be observed from FIG. 5B, while the slightly higher transmission observed in the measurement from 400 nm to 600 nm than that of the calculation can be attributed to the difference between the refractive indices of materials calibrated for the simulation and that of the fabricated devices. It is worth noting that the approximate 3.5% "background" reflection (i.e., the weak reflection beyond 600 nm wavelength in the plot) arising from the fused silica substrate back side reflection can be suppressed if introducing an additional index-match layer when integrating with the c-Si photovoltaic module, which would further improve the reflected color purity as well as the PCE of the whole device with the enhanced absorption of the underneath c-Si panel/PV device. In FIG. 5C, the color coordinates (x, y) of the reflection calculated from the simulated and measured spectra are depicted on the CIE 1931 chromaticity diagram, showing great match with each other.

Next, the calculated angle resolved reflection spectrum featuring flat dispersion property under unpolarized light illumination is described in FIG. 9A, showing a great match with the measured results in FIG. 9B. The reflection peak remains fairly constant with respect to the viewing angles up to ±60° from both the simulation and measurement results, which is a direct result of the high index of the materials (i.e., a-Si, $TiO_2$, and $Si_3N_4$) incorporated into the angle insensitive passive filter designs provided by the present disclosure. Considering that only the material deposition process is required, the proposed structure is an excellent candidate for the decorative PV applications with low manufacturing cost. The photographs of the fabricated sample against a black background under ambient light illumination in FIG. 9C clearly shows that a stable blue color can be seen at various viewing angles (incidence angles ranging from 0° to 60°) under ambient light illumination, which further validates the angular invariant performance of the present passive filter designs. Note that the black background is utilized to mimic a c-Si photovoltaic panel, which absorbs the transmitted light.

The broadband transmission and reflective colored appearance can be explained by multiple resonances at various wavelengths in the dielectric stacks. In FIG. 10A, a net phase shift, which includes two reflection phase shifts from the interfaces and the propagation phase accumulation, is plotted for each dielectric layer. Transmission is efficiently enhanced at those wavelengths where the net phase shift is equal to the multiple of 2π, i.e., creating the Fabry-Pérot (F-P) resonances to reduce the reflection, which consequently induces the transmission. Specifically, the reflection dip at about 300 nm results from the resonances inside the $SiO_2$ (resonance at 298 nm) and $Si_3N_4$ (resonance at 285 nm). Light transmission near 400 nm and 600 nm is significantly improved by exciting multiple resonances simultaneously within every layer (resonances at 381 nm, at 579 nm, and at 623 nm in $SiO_2$, resonances at 381 nm and at 577 nm in the top $TiO_2$, resonances at 396 nm and at 572 nm in the bottom $TiO_2$, and resonances at 394 nm and at 578 nm in $Si_3N_4$). Similarly, the reflection at longer wavelengths, including approximately 800 nm, approximately 1000 nm, and approximately 1100 nm, is well suppressed by the corresponding resonances as presented in the plot (resonances at 839 nm, at 943 nm, and at 1132 nm in $SiO_2$, resonance at 1132 nm in the top $TiO_2$, resonances at 799 nm, at 974 nm, and at 1133 nm in the bottom $TiO_2$, and resonances at 803 nm, at 1035 nm, and at 1134 nm in $Si_3N_4$). Due to the multiple resonances spanning almost the whole solar spectrum, broadband transmission is achieved with the passive filters prepared in accordance with certain aspects of the present disclosure with only 5 layers, which boosts the overall PCE of the final integrated solar cell/PV system.

On the other hand, unsuppressed reflection still exists between adjacent resonances (such as the reflection peaks at 347 nm (16%), at 452 nm (40%), at 662 nm (7%), and at 946 nm (4%)) since those resonances cannot cover every single point across the whole range. The higher reflection intensity at 452 nm compared to that at other wavelengths, which is due to both the strong absorption and low refractive index of a-Si at short wavelengths below 400 nm and longer wavelengths beyond 650 nm, respectively, directly leads into the blue reflection appearance of the structure here.

FIG. 10B provides the evolution of spectra of structures subsequently adding these 4 dielectric material layers. The decreasing reflection intensity with the wavelength in the spectrum of a single 5 nm a-Si layer (black line) clearly indicates that high refractive index directly results in the strong reflection, which is consistent with the explanation presented above. Right after putting only the $TiO_2$ atop, a strong reflection peak in the blue color range appears immediately with the suppressed reflection at both approximately 400 nm and approximately 600 nm. By adding the $SiO_2$ and the other two dielectrics on the backside of a-Si layer, the reflection outside the 400-500 nm range is further reduced by exciting other transmission resonances, thus achieving an optimized structure. It is worth noting the spectrum already is very close to the final result with the top two dielectrics ($TiO_2$ and $SiO_2$), which means the top dielectric plays a more important factor than the bottom stack in realizing the final high transmission.

On the other hand, the high efficiency of the broadband transmission results from anti-reflection (AR) effects of the dielectric layers featuring a gradient index profile. This can be validated by plotting the optical admittance diagram, which provides an effective way to visually represent the optical surface admittance of the multilayered structure. The optical admittance ($Y=\sqrt{\varepsilon/\mu}$) is the inverse of the impedance with $\varepsilon$ and $\mu$ being the permittivity and permeability, respectively, and equals to material complex refractive index due to the negligible magnetic effects at optical frequencies. The admittance locus is a circle for the transparent dielectrics and perfect electric conductors and a spiral for absorbing materials such as semiconductors and real metals. The admittance of the structure starts with the substrate and rotates on the circular or spiral trajectory as the thickness increases. The distance between the termination admittance point of the layered structure and the admittance of air (1, 0) determines the reflection intensity by $$R = \left(\frac{Y_0 - Y}{Y_0 + Y}\right)\left(\frac{Y_0 - Y}{Y_0 + Y}\right)^*, \quad (1)$$

where $Y_0$ and $Y_1$ refer to the air admittance and the termination admittance point of the structure, respectively. FIG. 11 plots the admittance diagram of the passive reflective blue colored filter structures prepared according to certain aspects of the present disclosure at various wavelengths, including 300 nm, 400 nm, 450 nm, 600 nm, 800 nm, 1000 nm, and 1100 nm. The length of the black line connecting the termination admittance point of the structure and air provides a measure of the reflectance of the structure. The final admittance positions are (0.76, −0.07), (1.04, −0.71), (4.33, 0.40), (1.22, −0.07), (1.07, 0.07), (1.16, 0.04), and (1.04, 0.03), corresponding to reflections of around 2.01%, 10.84%, 39.37%, 1.08%, 0.23%, 0.58%, and 0.06%, respectively. For simplicity, the silica substrate backside reflection is ignored in the calculation here. The only strong reflection intensity at 450 nm well explains the blue appearance and broadband high transmission.

FIG. 12 shows a measured current density-voltage (J-V) characteristics of an angle insensitive colored photovoltaic device assembly (PV system) incorporating a blue colored angle insensitive passive reflective filter and an integrated photovoltaic device compared to a c-Si panel photovoltaic with no passive filter. Due to the overall high transmission through the filter atop harvested by the c-Si cell, the entire PV system shows a short circuit current density $J_{sc}$~38.44 mA cm$^{-2}$, an open circuit voltage $V_{oc}$ approximately 585.0 mV, and a fill factor (FF) of approximately 75.69% corresponding to a PCE of approximately 17.02%, which is only approximately 3.16% lower than the efficiency of the original c-Si solar cell without colored filter covering ($J_{sc}$ is approximately 42.21 mAcm$^{-2}$, $V_{oc}$ approximately 611.2 mV, and FF approximately 78.23%, corresponding to a PCE of approximately 20.18%). This colored solar cell with great efficiency has effectively overcome the low efficiency limitation of conventional colored PVs. As mentioned above, the overall PCE can be further enhanced if using an index-match layer between the passive filter and the underlying c-Si photovoltaic cell to reduce the approximate 3.5% "background" reflection from the back of the silica substrate.

In real applications with exposure to daylight, even brighter reflected colors are often necessary for use as a decorative surface and this can be achieved by increasing a thickness of a high-index layer (e.g., a-Si layer), for example, from 5 nm to 10 nm, to produce a stronger reflection. Taking the blue color as an example, a schematic diagram of the structure with various layer thicknesses creating a blue reflection with the peak intensity of 55% at 416 nm (FIG. 13B) is illustrated in FIG. 13A. In this filter design, the ultrathin reflective layer of a-Si has a thickness of about 10 nm, the first layer of $SiO_2$ has a thickness of about 145 nm, the second layer of $TiO_2$ has a thickness of about 100 nm, the third layer of $TiO_2$ has a thickness of about 25 nm, and the fourth layer of $Si_3N_4$ has a thickness of about 110 nm.

Photos of the fabricated sample exhibiting the bright blue reflection are presented in FIG. 13C with a black substrate, showing great angular insensitive performance of the new design with higher reflection intensity. Resulting from the unaffected high transmission over a broadband wavelength range, approximately 15.49% PCE is maintained for the new PV system after integrating the higher-brightness filter on the top of the c-Si cells with $J_{sc}$ of approximately 35.23 mAcm$^{-2}$, $V_{oc}$ of approximately 582.90 mV, and FF of approximately 75.43% (FIG. 13D). Moreover, by simply tuning the thicknesses of the four dielectric layers (Si$_3$N$_4$/TiO$_2$/TiO$_2$/SiO$_2$), different types of blue colors have also been experimentally demonstrated with the resonance reflections of 56% at 455 nm and 55% at 477 nm, respectively, thereby providing more selections for practical use. The detailed structures for those three blue colors generated by the passive filters with enhanced reflection are list in Table 2.

TABLE 2

| Reflection Peak Wavelength for Blue Filter (nm) | Si$_3$N$_4$ Thickness (nm) | TiO$_2$ Thickness (nm) | a-Si Thickness (nm) | TiO$_2$ Thickness (nm) | SiO$_2$ Thickness (nm) |
|---|---|---|---|---|---|
| 416 | 110 | 25 | 10 | 100 | 145 |
| 455 | 115 | 30 | 12 | 110 | 165 |
| 477 | 120 | 30 | 12 | 120 | 170 |

In various aspects, the present disclosure provides an angle insensitive colored photovoltaic device assembly incorporating an angle insensitive passive colored reflective filter and an integrated photovoltaic device. Such a colored tandem solar cell system may have a PCE of greater 18% by integrating a passive colored filter on the top of a c-Si solar panel/photovoltaic device. The passive colored reflective filter includes just five layers, where a lossy semiconductor of high refractive index is sandwiched between two stacks or pairs of dielectrics. The passive colored reflective filter utilizes a gradient index profile. A distinct reflection color together with overall high transmission across the whole solar spectrum, where the latter is subsequently harvested by the c-Si photovoltaic panel beneath the filter, results in a high PCE. Due to the high index semiconductor material involved in the filter module, the entire system provides high brightness and great angular invariant appearance, for example, up to ±60°. In addition, different reflection colors with controllable intensity can be easily achieved by tuning the thicknesses of the dielectric and semiconductor layers. Considering that only a straightforward deposition method is involved in the fabrication of the structures provided by the present disclosure featuring high PCE, the present teachings have overcome many of the limitations associated with typical colored solar cells.

A green colored active angle insensitive solar cell is fabricated in accordance with the design described in FIG. 14A for demonstration and as shown in FIG. 14B (patterned areas for electrical measurement). The solar cell maintains the broadband high transmission except at wavelengths that are used for color generation as presented in FIG. 14C and an additional 2.80% PCE is acquired with only an 11 nm a-Si (FIG. 14D), which can further enhance the efficiency of an entire tandem solar panel (where the active angle insensitive filter is coupled with a second photovoltaic cell/device). Other colors (blue and red) can also be achieved by slightly tuning the thickness of each layer as shown by the simulated results in FIG. 15. The detailed designs for all red-green-blue (RGB) colored a-Si solar cells prepared in accordance with the present disclosure are summarized in Table 1.

TABLE 3

|  | AZO | p-SiOx | a-Si | n-SiOx | ITO |
|---|---|---|---|---|---|
| Blue | 1 μm | 19 nm | 10 nm | 19 nm | 105 nm |
| Green | 1 μm | 19 nm | 13 nm | 19 nm | 135 nm |
| Red | 1 μm | 19 nm | 55 nm | 19 nm | 170 nm |

Table 3 shows thicknesses of each layer for reflective RGB colored active filter a-Si solar cells prepared in accordance with certain aspects of the present disclosure. The deposition conditions for all materials involved in forming these colored a-Si solar cells is as follows. First, n-SiO$_x$ is prepared by RF(f=13.56 MHz) plasma enhanced chemical vapor deposition technique at the temperature of 210° C. The flow rates of SiH$_4$, H$_2$ and CO$_2$ are 2 sccm, 300 sccm and 3 sccm, respectively. PH$_3$ is used as n-type dopant for SiO$_x$ layer and its flow rate is 2 sccm. The deposition pressure and power density are 1.3 Torr and 69 mW/cm. A deposition rate is 0.8 nm/min. The distance between substrate and electrode is about 20 mm.

The p-SiO$_x$ layers are fabricated by RF plasma enhanced chemical vapor deposition technique at the temperature of 200° C. The flow rates of SiH$_4$, H$_2$ and CO$_2$ are 400 sccm, 2 sccm, and 0.5 sccm, respectively. B$_2$H$_6$ is used as n-type dopant for SiO$_x$ layer and its flow rate is 0.75 sccm. The deposition pressure and power density are 1.3 Torr and 69 mW/cm$^2$. The distance between substrate and electrode is about 20 mm.

ITO thin films are grown by reactive thermal evaporation with the substrate temperature at 175° C. In/Sn alloy (10 wt. % Sn) and oxygen are used as source materials. The oxygen partial pressure is 0.25 Pa. The thickness is 75 nm and the deposition rate is 0.625 nm/s.

a-Si is fabricated by RF plasma enhanced chemical vapor deposition technique at the temperature of 160° C. The flow rates of SiH$_4$ and H$_2$ are 250 sccm and 20 sccm. The deposition pressure and power density are 1.9 Torr and 49 mW/cm$^2$.

The AZO electrode is formed with the following sputtering conditions: temperature: 325° C.; Pressure: 1.5 mTorr; Power: 150 w; Time: 8 hours.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An angle insensitive colored photovoltaic device assembly comprising:
   a colored reflective filter comprising:
      an ultrathin reflective layer comprising silicon, having a thickness of less than or equal to about 15 nm, and defining a first side and a second side;
      a transparent first pair of dielectric materials adjacent to the first side of the ultrathin reflective layer, wherein the first pair comprises a first layer of a dielectric material and a second layer of a distinct dielectric material;
      a transparent second pair of dielectric materials adjacent to the second side of the ultrathin reflective layer, wherein the second pair comprises a third layer of a dielectric material and a fourth layer of a distinct dielectric material, wherein the filter is capable of transmitting a first portion of an electromagnetic spectrum having a first range of predetermined wavelengths and reflecting a second portion of the electromagnetic spectrum having a second range of predetermined wavelengths to generate a reflected output; and a photovoltaic device adjacent to the colored reflective filter, wherein the photovoltaic device comprises at least one photoactive material.

2. The angle insensitive colored photovoltaic device assembly of claim 1, wherein a power conversion efficiency of the photovoltaic device is greater than or equal to about 18%.

3. The angle insensitive colored photovoltaic device assembly of claim 1, wherein the reflected output with the second range of predetermined wavelengths is in a visible light range and has a color selected from the group consisting of: red, green, blue, and combinations thereof.

4. The angle insensitive colored photovoltaic device assembly of claim 1, wherein the dielectric material forming each of the first layer, the second layer, the third layer, and the fourth layer is independently selected from the group consisting of: silicon nitride ($Si_3N_4$), titanium oxide ($TiO_2$), and silicon dioxide ($SiO_2$), zinc oxide (ZnO), hafnium oxide ($HfO_2$), molybdenum trioxide ($MoO_3$), tantalum pentoxide ($Ta_2O_5$), niobium pentoxide ($Nb_2O_5$), oxide tungsten trioxide ($WO_3$), zinc selenide (ZnSe), zinc sulfide (ZnS), aluminum oxide ($Al_2O_3$), magnesium fluoride ($MgF_2$), and polymers with a refractive index greater than or equal to about 1.6.

5. The angle insensitive colored photovoltaic device assembly of claim 1, wherein the dielectric material forming each of the first layer, the second layer, the third layer, and the fourth layer is independently selected from the group consisting of: silicon nitride ($Si_3N_4$), zinc selenide (ZnSe), titanium oxide ($TiO_2$), and silicon dioxide ($SiO_2$) and the first layer has a thickness of greater than or equal to about 50 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 50 nm to less than or equal to about 300 nm.

6. The angle insensitive colored photovoltaic device assembly of claim 1, wherein the reflected output having the second range of predetermined wavelengths exhibits: (i) blue color, wherein the ultrathin reflective layer has a thickness of greater than or equal to about 5 nm to less than or equal to about 12 nm, the first layer has a thickness of greater than or equal to about 50 nm to less than or equal to about 200 nm, the second layer has a thickness of greater than or equal to about 10 nm to less than or equal to about 150 nm, the third layer has a thickness of greater than or equal to about 10 nm to less than or equal to about 150 nm, and the fourth layer has a thickness of greater than or equal to about 50 nm to less than or equal to about 200 nm; (ii) a green color, wherein the ultrathin reflective layer has a thickness of greater than or equal to about 5 nm to less than or equal to about 12 nm, the first layer has a thickness of greater than or equal to about 100 nm to less than or equal to about 200 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 200 nm; or (iii) a red color, wherein the ultrathin reflective layer has a thickness of greater than or equal to about 5 nm to less than or equal to about 12 nm, the first layer has a thickness of greater than or equal to about 100 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 300 nm.

7. An angle insensitive colored photovoltaic device assembly comprising:
    a colored reflective filter comprising:
        an ultrathin reflective layer comprising an amorphous silicon (a-Si) material defining a first side and a second side;
        a transparent first pair of dielectric materials adjacent to the first side of the ultrathin reflective layer, wherein the first pair comprises a first layer of a dielectric material and a second layer of a distinct dielectric material;
        a transparent second pair of dielectric materials adjacent to the second side of the ultrathin reflective layer, wherein the second pair comprises a third layer of a dielectric material and a fourth layer of a distinct dielectric material, wherein the filter is capable of transmitting a first portion of an electromagnetic spectrum having a first range of predetermined wavelengths and reflecting a second portion of the electromagnetic spectrum having a second range of predetermined wavelengths to generate a reflected output; and
    a photovoltaic device adjacent to the colored reflective filter, wherein the photovoltaic device comprises at least one photoactive material comprising a crystalline silicon (c-Si) material.

8. The angle insensitive colored photovoltaic device assembly of claim 7, wherein a power conversion efficiency of the photovoltaic device is greater than or equal to about 18%.

9. The angle insensitive colored photovoltaic device assembly of claim 7, wherein the ultrathin reflective layer has a thickness of less than or equal to about 15 nm.

10. The angle insensitive colored photovoltaic device assembly of claim 7, wherein the reflected output with the second range of predetermined wavelengths is in a visible light range and has a color selected from the group consisting of: red, green, blue, and combinations thereof.

11. The angle insensitive colored photovoltaic device assembly of claim 7, wherein the dielectric material forming each of the first layer, the second layer, the third layer, and the fourth layer is independently selected from the group consisting of: silicon nitride ($Si_3N_4$), titanium oxide ($TiO_2$), and silicon dioxide ($SiO_2$), zinc oxide (ZnO), hafnium oxide ($HfO_2$), molybdenum trioxide ($MoO_3$), tantalum pentoxide ($Ta_2O_5$), niobium pentoxide ($Nb_2O_5$), oxide tungsten trioxide ($WO_3$), zinc selenide (ZnSe), zinc sulfide (ZnS), aluminum oxide ($Al_2O_3$), magnesium fluoride ($MgF_2$), and polymers with a refractive index greater than or equal to about 1.6.

12. The angle insensitive colored photovoltaic device assembly of claim 7, wherein the dielectric material forming each of the first layer, the second layer, the third layer, and the fourth layer is independently selected from the group consisting of: silicon nitride (Si$_3$N$_4$), zinc selenide (ZnSe), titanium oxide (TiO$_2$), and silicon dioxide (SiO$_2$) and the first layer has a thickness of greater than or equal to about 50 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 50 nm to less than or equal to about 300 nm.

13. The angle insensitive colored photovoltaic device assembly of claim 7, wherein the reflected output having the second range of predetermined wavelengths exhibits: (i) blue color, wherein the ultrathin reflective layer has a thickness of greater than or equal to about 5 nm to less than or equal to about 12 nm, the first layer has a thickness of greater than or equal to about 50 nm to less than or equal to about 200 nm, the second layer has a thickness of greater than or equal to about 10 nm to less than or equal to about 150 nm, the third layer has a thickness of greater than or equal to about 10 nm to less than or equal to about 150 nm, and the fourth layer has a thickness of greater than or equal to about 50 nm to less than or equal to about 200 nm; (ii) a green color, wherein the ultrathin reflective layer has a thickness of greater than or equal to about 5 nm to less than or equal to about 12 nm, the first layer has a thickness of greater than or equal to about 100 nm to less than or equal to about 200 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 200 nm; or (iii) a red color, wherein the ultrathin reflective layer has a thickness of greater than or equal to about 5 nm to less than or equal to about 12 nm, the first layer has a thickness of greater than or equal to about 100 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 300 nm.

14. An angle insensitive colored photovoltaic device assembly comprising:
 a colored reflective filter comprising:
  an ultrathin reflective layer comprising silicon and defining a first side and a second side;
  a transparent first pair of dielectric materials adjacent to the first side of the ultrathin reflective layer, wherein the first pair comprises a first layer of a dielectric material and a second layer of a distinct dielectric material;
  a transparent second pair of dielectric materials adjacent to the second side of the ultrathin reflective layer, wherein the second pair comprises a third layer of a dielectric material and a fourth layer of a distinct dielectric material, wherein the filter is capable of transmitting a first portion of an electromagnetic spectrum having a first range of predetermined wavelengths and reflecting a second portion of the electromagnetic spectrum having a second range of predetermined wavelengths in a visible light range to generate a reflected output having a color selected from the group consisting of: red, green, blue, and combinations thereof; and
 a photovoltaic device adjacent to the colored reflective filter, wherein the photovoltaic device comprises at least one photoactive material.

15. The angle insensitive colored photovoltaic device assembly of claim 14, wherein the dielectric material forming each of the first layer, the second layer, the third layer, and the fourth layer is independently selected from the group consisting of: silicon nitride (Si$_3$N$_4$), titanium oxide (TiO$_2$), and silicon dioxide (SiO$_2$), zinc oxide (ZnO), hafnium oxide (HfO$_2$), molybdenum trioxide (MoO$_3$), tantalum pentoxide (Ta$_2$O$_5$), niobium pentoxide (Nb$_2$O$_5$), oxide tungsten trioxide (WO$_3$), zinc selenide (ZnSe), zinc sulfide (ZnS), aluminum oxide (Al$_2$O$_3$), magnesium fluoride (MgF$_2$), and polymers with a refractive index greater than or equal to about 1.6.

16. The angle insensitive colored photovoltaic device assembly of claim 14, wherein the dielectric material forming each of the first layer, the second layer, the third layer, and the fourth layer is independently selected from the group consisting of: silicon nitride (Si$_3$N$_4$), zinc selenide (ZnSe), titanium oxide (TiO$_2$), and silicon dioxide (SiO$_2$) and the first layer has a thickness of greater than or equal to about 50 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 50 nm to less than or equal to about 300 nm.

17. The angle insensitive colored photovoltaic device assembly of claim 14, wherein the reflected output having the second range of predetermined wavelengths exhibits: (i) blue color, wherein the ultrathin reflective layer has a thickness of greater than or equal to about 5 nm to less than or equal to about 12 nm, the first layer has a thickness of greater than or equal to about 50 nm to less than or equal to about 200 nm, the second layer has a thickness of greater than or equal to about 10 nm to less than or equal to about 150 nm, the third layer has a thickness of greater than or equal to about 10 nm to less than or equal to about 150 nm, and the fourth layer has a thickness of greater than or equal to about 50 nm to less than or equal to about 200 nm; (ii) a green color, wherein the ultrathin reflective layer has a thickness of greater than or equal to about 5 nm to less than or equal to about 12 nm, the first layer has a thickness of greater than or equal to about 100 nm to less than or equal to about 200 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 200 nm; or (iii) a red color, wherein the ultrathin reflective layer has a thickness of greater than or equal to about 5 nm to less than or equal to about 12 nm, the first layer has a thickness of greater than or equal to about 100 nm to less than or equal to about 300 nm, the second layer has a thickness of greater than or equal to about 10 nm to less than or equal to about 200 nm, the third layer has a thickness of greater than or equal to about 10 nm to less than or equal to about 200 nm, and the fourth layer has a thickness of greater than or equal to about 100 nm to less than or equal to about 300 nm.

\* \* \* \* \*